US011038155B2

(12) United States Patent
Ogata et al.

(10) Patent No.: US 11,038,155 B2
(45) Date of Patent: Jun. 15, 2021

(54) FILM FORMATION DEVICE, VAPOR-DEPOSITED FILM FORMATION METHOD, AND ORGANIC EL DISPLAY DEVICE PRODUCTION METHOD

(71) Applicant: SAKAI DISPLAY PRODUCTS CORPORATION, Sakai (JP)

(72) Inventors: Hidenori Ogata, Sakai (JP); Susumu Sakio, Sakai (JP); Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/616,442

(22) PCT Filed: Mar. 8, 2018

(86) PCT No.: PCT/JP2018/009045
§ 371 (c)(1),
(2) Date: Mar. 18, 2020

(87) PCT Pub. No.: WO2019/171545
PCT Pub. Date: Sep. 12, 2019

(65) Prior Publication Data
US 2020/0220114 A1 Jul. 9, 2020

(51) Int. Cl.
*H01L 51/00* (2006.01)
*C23C 14/50* (2006.01)
(Continued)

(52) U.S. Cl.
CPC ............ *H01L 51/56* (2013.01); *C23C 14/042* (2013.01); *C23C 14/243* (2013.01); *C23C 14/50* (2013.01);
(Continued)

(58) Field of Classification Search
CPC ... H01L 51/56; H01L 51/001; H01L 51/0011; H01L 51/0012; H01L 45/1616;
(Continued)

(56) References Cited

U.S. PATENT DOCUMENTS

2007/0054051 A1 3/2007 Arai et al.
2009/0291234 A1* 11/2009 Suzuki ................. C23C 14/325
427/577

(Continued)

FOREIGN PATENT DOCUMENTS

JP S63-143262 A 6/1988
JP 2004-146369 A 5/2004
(Continued)

OTHER PUBLICATIONS

International Search Report of International Application No. PCT/JP2018/009045.

*Primary Examiner* — Didarul A Mazumder
(74) *Attorney, Agent, or Firm* — ScienBiziP, P.C.

(57) ABSTRACT

A film formation apparatus according to an embodiment comprising: a substrate holder for holding a substrate in a standing position relative to the horizontal plane, the substrate having a vapor deposition surface on which a vapor deposition layer is formed; and an evaporation source to supply a vapor deposition material onto the vapor deposition surface while moving relative to the substrate holder upward and/or downward, the evaporation source being disposed in a region which the vapor deposition surface of the substrate held by the substrate holder is to face. The substrate holder is configured to hold the substrate in an inclined orientation relative to the vertical plane such that the upper end of the substrate is located away from the evaporation source. The apparatus further comprises an adjustment means for reduc- (Continued)

ing a variation in the thickness of the vapor deposition layer, which results from the inclination of the substrate.

16 Claims, 9 Drawing Sheets

(51) Int. Cl.
*H01L 51/56* (2006.01)
*C23C 14/04* (2006.01)
*C23C 14/24* (2006.01)
*H01L 27/32* (2006.01)

(52) U.S. Cl.
CPC ........ *H01L 27/3244* (2013.01); *H01L 51/001* (2013.01); *H01L 51/0011* (2013.01)

(58) Field of Classification Search
CPC ..... H01L 45/1625; H01C 17/08; C23C 14/50; C23C 14/24; C23C 14/04; H05B 33/10
USPC .......................................................... 438/23
See application file for complete search history.

(56) References Cited

U.S. PATENT DOCUMENTS

| | | | | |
|---|---|---|---|---|
| 2010/0075036 | A1* | 3/2010 | Okazaki | C23C 14/226 427/255.5 |
| 2011/0014519 | A1* | 1/2011 | Okazaki | C23C 14/562 429/209 |
| 2012/0256227 | A1* | 10/2012 | Tsurume | H01L 51/5228 257/99 |
| 2013/0252353 | A1* | 9/2013 | Kawato | C23C 14/243 438/14 |
| 2014/0008212 | A1* | 1/2014 | Yamamoto | C23C 14/225 204/192.1 |
| 2020/0083452 | A1* | 3/2020 | Heymanns | H01L 51/0012 |

FOREIGN PATENT DOCUMENTS

| | | |
|---|---|---|
| JP | 2005-281858 A | 10/2005 |
| JP | 2007-070687 A | 3/2007 |
| JP | 2010-165571 A | 7/2010 |
| JP | 2010-209459 A | 9/2010 |
| JP | 2012-211352 A | 11/2012 |
| WO | 2004/028214 A1 | 4/2004 |

* cited by examiner

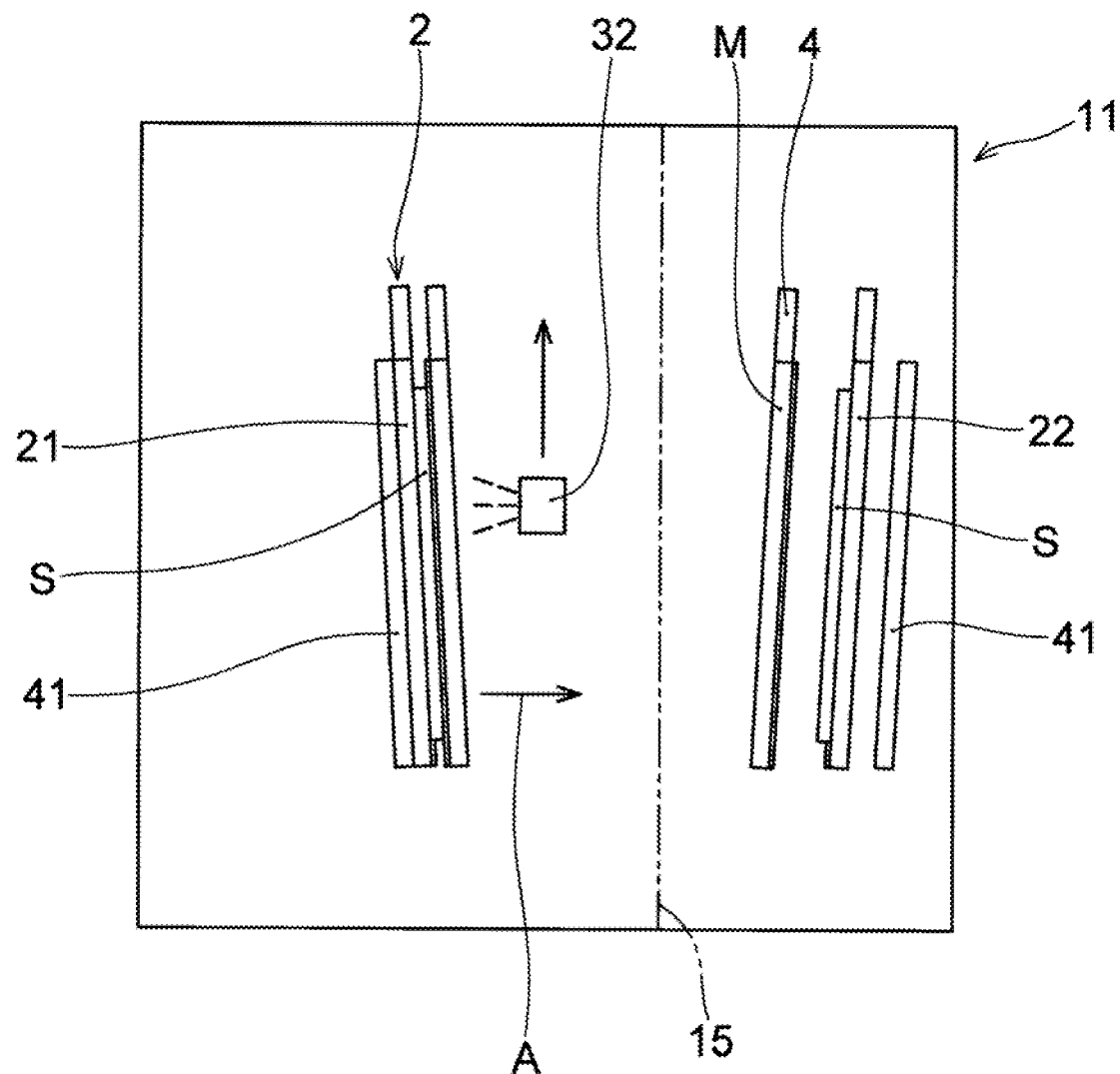

FILM FORMATION DEVICE, VAPOR-DEPOSITED FILM FORMATION METHOD, AND ORGANIC EL DISPLAY DEVICE PRODUCTION METHOD

TECHNICAL FIELD

The present invention relates to a film forming apparatus, a method of forming a vapor deposition layer, and a method of manufacturing an organic-EL display apparatus.

BACKGROUND ART

In the related art, forming of a thin film to serve a specific function in manufacturing electronic components such as semiconductor devices, optical instruments, and electronic equipment units such as display apparatuses is carried out using the vapor deposition method. For example, molecules of a vapor deposition material vaporized or sublimed by being heated stick and deposit onto a surface of a member to be vapor deposited such as a substrate or a film, causing a vapor deposition layer comprising the deposited vapor deposition material to be formed. Generally, as the area of vapor deposition layer formed in one cycle of processes (or one batch process) increases, the efficiency of the vapor deposition process improves. Therefore, particularly in the field of display apparatuses such as organic-EL display apparatuses, upsizing of a substrate on which a vapor deposition layer of an organic matter, for example, is to be formed is proceeding with upsizing of a screen and expansion of the market. Patent document 1 discloses that, to avoid a decreased accuracy in alignment between the substrate and a vapor deposition mask in conjunction with such upsizing of the substrate to be vapor deposited, alignment and vapor deposition are carried out while the substrate to be vapor deposited is held in a vertical state.

PRIOR ART DOCUMENT

Patent Document
Patent Document 1: JP 2010-209459 A

SUMMARY OF THE INVENTION

Problem to be Solved by the Invention

In the vapor deposition process, forming a vapor deposition layer having no unevenness with respect to the thickness thereof is needed. For example, in forming a vapor deposition layer such as a vapor deposition layer making up a light-emitting layer in an organic-EL display panel, wherein optical or electrical properties thereof change in accordance with the thickness thereof, a layer thickness being strictly uniform on the entire surface of a substrate to be vapor deposited is needed. On the other hand, it is believed that the trend toward upsizing of a member to be vapor deposited such as the previously-described substrate makes forming of a vapor deposition layer having a uniform layer thickness over the entire surface difficult.

Thus, an object of the present invention is to provide a film forming apparatus allowing forming of a vapor deposition layer being uniform in a thickness thereof on the entire surface and, even more, allowing avoiding an increase of the installation area being in conjunction with upsizing of the member to be vapor deposited, and a film forming method allowing forming of the vapor deposition layer being uniform in a thickness thereof as such and allowing avoiding an increase of the size of the film forming apparatus. Moreover, another object of the present invention is to provide an organic-EL display apparatus manufacturing method allowing a reduced variation of display quality.

Means to Solve the Problem

A film forming apparatus according to first embodiment of the present invention comprises a substrate holder to hold a substrate in a standing position relative to a horizontal surface, the substrate comprising a surface to be vapor deposited, the surface being a surface on which a vapor deposition layer is formed; and an evaporation source to supply a vapor deposition material toward the surface to be vapor deposited while carrying out a relative movement in at least either one of upward and downward orientations relative to the substrate holder, the evaporation source being provided in a region toward which the surface to be vapor deposited of the substrate being held by the substrate holder is to be oriented, wherein the substrate holder is configured to hold the substrate with an inclination relative to a vertical surface such that an upper end of the substrate is brought to be farther away from the evaporation source, and the film forming apparatus further comprises an adjusting instrument to decrease a variation in a thickness of the vapor deposition layer on the surface to be vapor deposited, the variation being based on the inclination of the substrate.

A method of forming a vapor deposition layer according to second embodiment of the present invention comprises: arranging, in a vapor deposition apparatus, a substrate in a standing position relative to a horizontal surface, the substrate comprising a surface to be vapor deposited, the surface being a surface on which a vapor deposition layer is formed; and depositing a vapor deposition material onto the surface to be vapor deposited by supplying the vapor deposition material from an evaporation source being provided in a region toward which the surface to be vapor deposited of the substrate is oriented, while causing the evaporation source to carry out a relative movement in at least either one of upward and downward orientations relative to the substrate, wherein at the time of supplying the vapor deposition material, the substrate is held with an inclination relative to a vertical surface such that an upper end of the substrate is brought to be farther away from the evaporation source, and the vapor deposition material is deposited while a variation in a thickness of the vapor deposition layer is decreased by compensating for a difference in vapor deposition efficiency within the surface to be vapor deposited, the difference being based on the inclination of the substrate.

A method of manufacturing an organic-EL display apparatus according to third embodiment of the present invention comprises: forming at least a TFT and a first electrode on a supporting substrate; vapor depositing an organic material above the supporting substrate using the method of forming a vapor deposition layer according to the second embodiment, and thereby forming an organic deposition layer; and forming a second electrode on the organic deposition layer.

Effects of the Invention

The first and second embodiments of the present invention make it possible to form a vapor deposition layer having high uniformity in its thickness on the entire surface and, even more, to avoid an increase of the installation area of a film forming apparatus in conjunction with upsizing of a member to be vapor deposited. Moreover, the third embodiment of the present invention makes it possible to reduce a variation in display quality of an organic-EL display apparatus.

BRIEF DESCRIPTION OF THE DRAWINGS

FIG. 4A shows a diagram of one example of an operation of the film forming apparatus according to one embodiment.

EMBODIMENT FOR CARRYING OUT THE INVENTION

Figure 1:
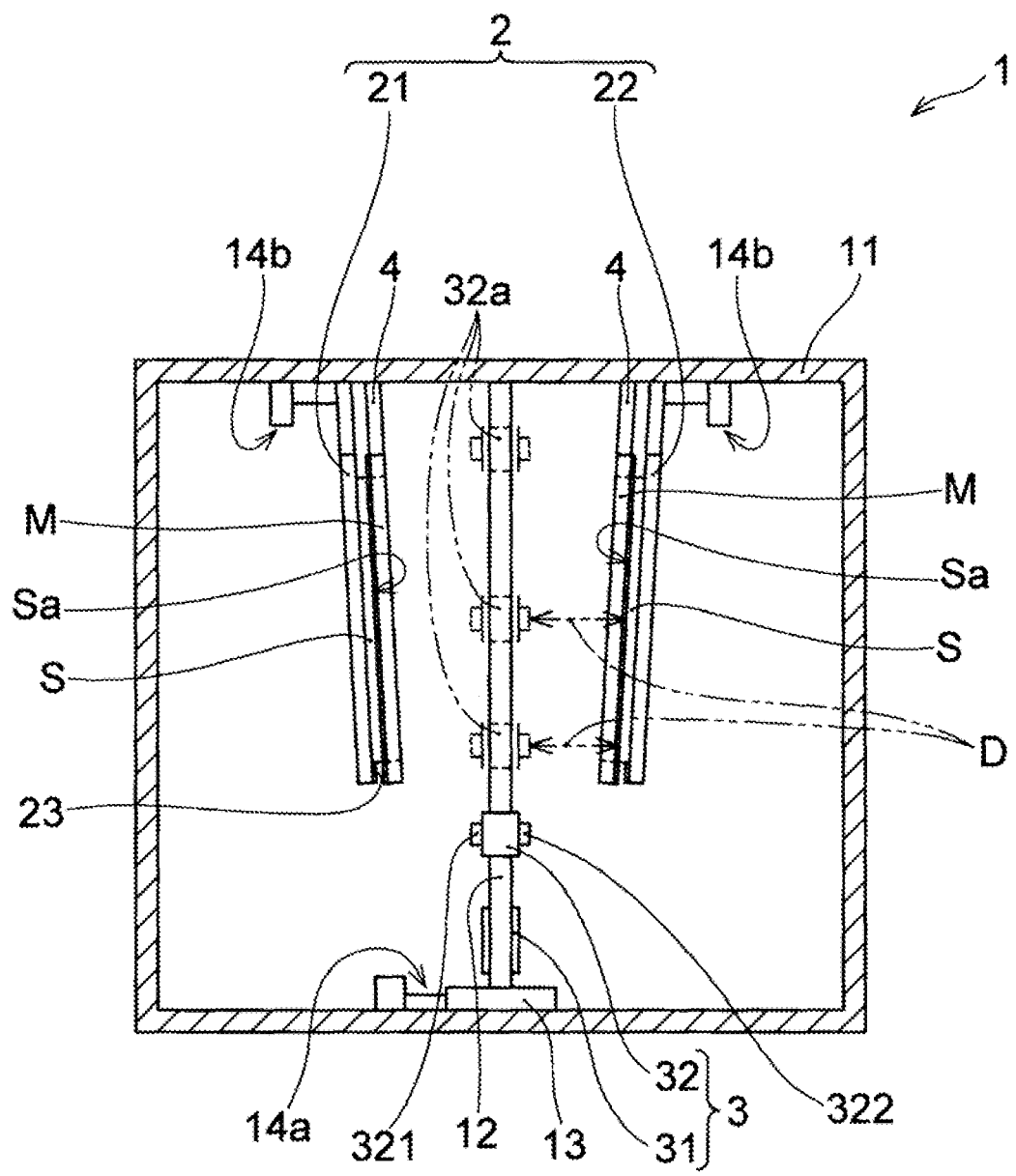
FIG. 1 schematically shows a front view of one example of a film forming apparatus according to one embodiment of the present invention.

From a viewpoint of avoiding an increase of the installation area of a film forming apparatus in conjunction with upsizing of a member to be vapor deposited such as a substrate, it is advantageous to carry out vapor deposition with a substrate being in a standing position relative to a horizontal surface, the present inventors have intensively carried out studies on improving the uniformity of the layer thickness in such a vertical-type vapor deposition method In a large number of vapor deposition processes such as forming an organic layer in an organic-EL display apparatus, a vapor deposition mask comprising apertures each having a given shape and size is used and it is preferable that the vapor deposition mask be in close contact with a substrate to be vapor deposited at the time of vapor deposition. Also, from the viewpoint of stability of the close contact between the vapor deposition mask and the substrate, it is preferable that the substrate to be vapor deposited be held such that a surface to be vapor deposited is a little inclined upward relative to the vertical surface. This is because, in this way, gravity can contribute to the surface to be vapor deposited and the vapor deposition mask being in close contact with each other when the vapor deposition mask has been put onto the surface to be vapor deposited.

In the vertical-type vapor deposition method, the evaporation source is moved in the vertical direction from the lower end portion or the upper end portion of the substrate to be vapor deposited to the opposite end portion thereof, for example, while supplying the vapor deposition material, and, as a result, a vapor deposition layer is formed on the entire surface of the substrate to be vapor deposited. However, the present inventors have found that in a film forming apparatus or a film forming method in which a vapor deposition layer is formed in this way, a strict uniformity of a thickness of the layer is difficult to be obtained. In other words, it has been found that, as the substrate to be vapor deposited is held such that the surface to be vapor deposited is inclined with respect to the vertical surface, distance between the evaporation source and a portion facing the evaporation source in the horizontal direction of the substrate to be vapor deposited changes in conjunction with a movement of the evaporation source in the vertical direction, and the change of the distance can influence the layer thickness. Specifically, it has been found that the layer forming speed differs between the upper side and the lower side of the surface to be vapor deposited, and as a result, there is a tendency for the vapor deposition layer to be formed thicker at the lower side and formed thinner at the upper side.

When there is such an unevenness in layer thickness, in a case that one or a few organic-EL display panels are formed, for example, onto one substrate to be vapor deposited, the luminance unevenness and chromaticity unevenness can occur in the display screen in a single organic-EL display panel and a variation in display performance can also occur among individual panels. Moreover, in a case that organic-EL display panels each comprising a relatively small display screen are formed in a large number onto one substrate to be vapor deposited, a variation can also occur at least among individual panels. In this way, unevenness in thickness of the vapor deposition layer in the one substrate to be vapor deposited can influence the stability of quality and the properties of various products comprising the vapor deposition layer such as the organic-EL display apparatus. The present inventors have found, as a result of studying under such expertise, a film forming apparatus comprising a means of adjustment to reduce a variation, due to an inclination of the substrate, in layer thickness of a vapor deposition layer and a method of forming a layer to deposit a vapor deposition material while reducing such a variation in layer thickness.

Herein below, a film forming apparatus, a method of forming a vapor deposition layer, and a method of manufacturing an organic-EL display apparatus according to the embodiments of the present invention are explained with reference to the drawings. Material for and the shape of each of the constituting elements and relative positional relationships thereof in the below-described embodiments are merely exemplary. The film forming apparatus, the method of forming a vapor deposition layer, and the method of manufacturing an organic-EL display apparatus according to the present invention are not to be construed to be limited thereto.

(Film Forming Apparatus)

Figure 2:
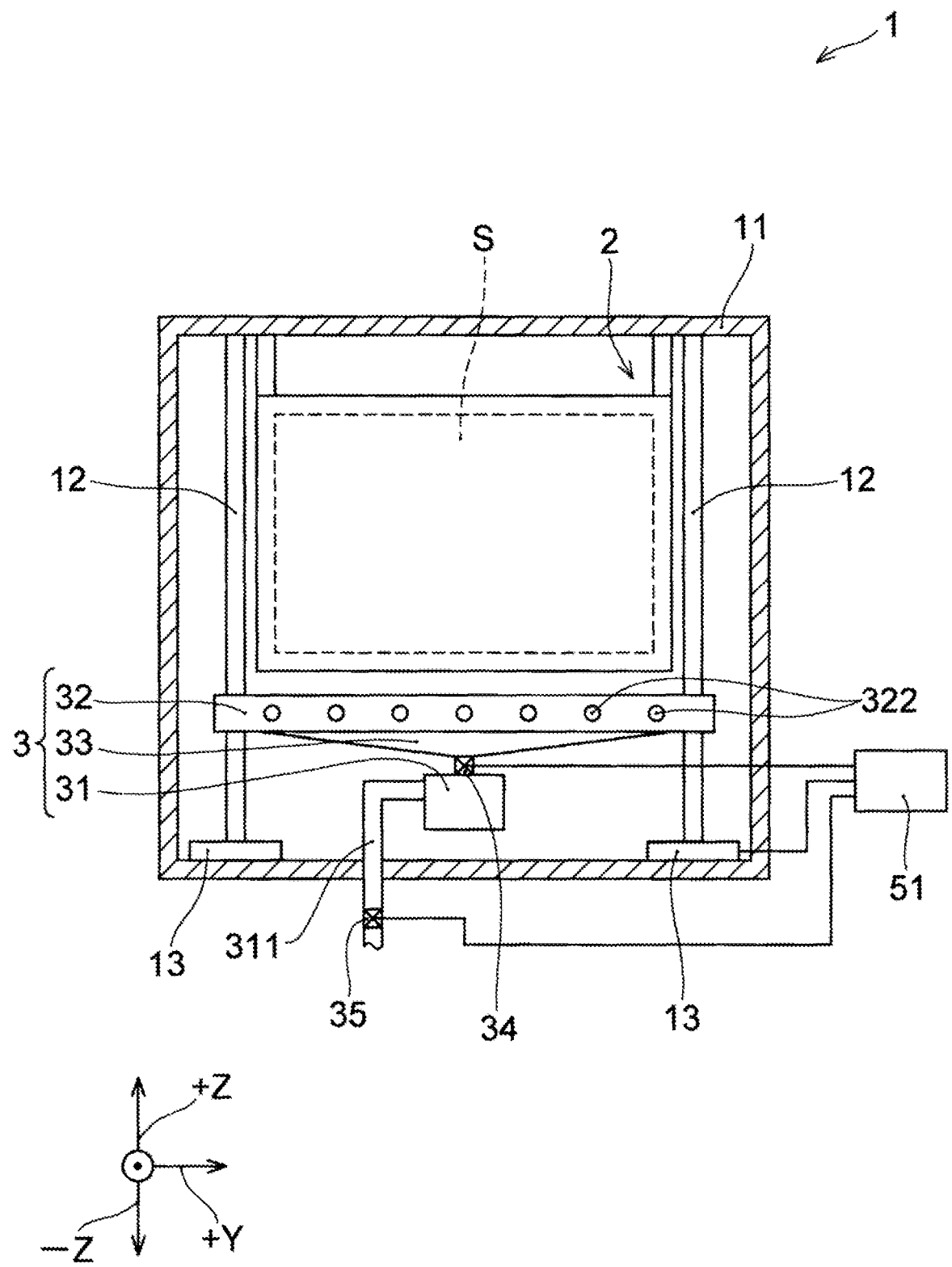
FIG. 2 schematically shows a lateral view of one example of the film forming apparatus shown in FIG. 1.

FIG. 1 schematically shows a front view of a film forming apparatus 1 according to first embodiment, while FIG. 2 schematically shows a lateral view (right lateral view in FIG. 1) of the film forming apparatus 1. As shown in FIGS. 1 and 2, the film forming apparatus 1 according to the present embodiment comprises a substrate holder 2 to hold a substrate (a substrate to be vapor deposited) S in a standing position relative to a horizontal surface, the substrate S comprising a surface to be vapor deposited Sa, the surface Sa being a surface on which a vapor deposition layer is formed; and an evaporation source 3 to supply a vapor deposition material toward the surface to be vapor deposited Sa. The evaporation source 3 is provided in a region toward which the surface to be vapor deposited Sa of the substrate S being held by the substrate holder 2 is to be oriented. The evaporation source 3 supplies the vapor deposition material toward the surface to be vapor deposited Sa while carrying out a relative movement in at least either one of upward and downward orientations relative to the substrate holder 2. In FIG. 1, a supplying unit of the evaporation source 3 at the time of rising of the evaporation source 3 is depicted in chain double dashed lines at three locations with a reference numeral 32a. Furthermore, the film forming apparatus 1 according to the present embodiment comprises an adjusting instrument to decrease a variation in a thickness of the vapor deposition layer on the surface to be vapor deposited Sa, the variation being based on an inclination of the substrate S. The adjusting instrument is to be described below. In the explanations below, the term "relative" refers to the relationship between the evaporation source 3 and the substrate holder 2 (or the substrate S) except where the subject thereof is indicated explicitly.

The film forming apparatus 1 being exemplified in FIG. 1 further comprises a mask holder 4 to hold a vapor deposition mask M to be put onto the surface to be vapor deposited Sa of the substrate S. Moreover, the substrate holder 2 provided to the film forming apparatus 1 comprises a first holding unit 21 and a second holding unit 22 which hold the respective substrates S such that respective surfaces to be vapor deposited Sa of the respective substrates face each other. Therefore, the mask holder 4 is also configured to be able to hold the two vapor deposition masks M such that surfaces to be oriented to the evaporation source 3 of the two vapor deposition masks M face each other. Then, the evaporation source 3 supplies the vapor deposition material while carrying out the relative movement relative to the substrate holder 2 between the substrate S held by the first holding unit 21 and the substrate S held by the second holding unit 22.

The film forming apparatus 1 comprises a chamber 11 and the substrate holder 2, the evaporation source 3, and the mask holder 4 are provided in the interior of the chamber 11. While not shown, the chamber 11 comprises an air discharging apparatus, the interior of the chamber 11 is brought to a vacuum state having a degree of vacuum of approximately $10^{-3}$ Pa to $10^{-4}$ Pa, for example.

The evaporation source 3 in the examples in FIGS. 1 and 2 comprises an evaporation unit 31 which comprises a crucible (not shown) comprising a heating mechanism and heat the vapor deposition material to vaporize or sublime the vapor deposition material, and a supplying unit 32 to supply the vaporized or sublimed vapor deposition material toward the substrate S. The evaporation unit 31 and the supplying unit 32 are connected via a relay unit 33 consisting of a hollow body, and the vapor deposition material being vaporized or sublimed in the evaporation unit 31 flows into the supplying unit 32 through the relay unit 33. Unlike the examples in FIGS. 1 and 2, the evaporation unit 31 and the supplying unit 32 can be integrally formed in appearance.

The supplying unit 32 comprises a nozzle to supply the vapor deposition material. In the examples in FIGS. 1 and 2, the supplying unit 32 comprises a first nozzle 321 to supply the vapor deposition material toward the substrate S held by the first holding unit 21, and a second nozzle 322 to supply the vapor deposition material toward the substrate S held by the second holding unit 22. The first nozzle 321 and the second nozzle 322 are oriented to respective orientations opposite each other and supply the vapor deposition material toward mutually opposite orientations respectively. The supplying unit 32 has a longitudinal direction in a direction (+Y direction in FIG. 2) being orthogonal to the moving direction of the evaporation source 3 (+Z/−Z direction in FIGS. 1 and 2) and parallel to the surface to be vapor deposited Sa of the substrate S being held by the substrate holder 2 and makes up a so-called linear source. The supplying unit 32 exemplified in FIGS. 1 and 2 comprises the first nozzle 321 in a plurality and the second nozzle 322 in a plurality, each of the first nozzles 321 and the second nozzles 322 being aligned along the above-mentioned longitudinal direction.

An air pipe 311 is connected to the evaporation unit 31. The end portion opposite to one end being connected to the evaporation unit 31 of the air pipe 311 is connected to an external carrier gas supply source (not shown). An inert gas such as argon gas, helium gas, krypton gas, or nitrogen gas, for example, is supplied to the evaporation unit 31 via the air pipe 311 as a carrier gas from the external carrier gas supply source (not shown). Then, the carrier gas and the vaporized or sublimed vapor deposition material mix with each other and are supplied from the supplying unit 32 through the relay unit 33. Therefore, the flow rate of the carrier gas can be adjusted to adjust the flow rate of the vapor deposition material. Moreover, the carrier gas can be used to realize a high usage efficiency of the vapor deposition material.

The evaporation source 3 supplies the vapor deposition material while carrying out the relative movement in at least either one of upward and downward orientations (an orientation of the gravity or an orientation opposite to the gravity direction in a case that the film forming apparatus 1 is installed on the horizontal surface) relative to the substrate holder 2 and the mask holder 4. In the examples in FIGS. 1 and 2, the evaporation source 3 is held by a strut 12 at each of both ends in the longitudinal direction of the supplying unit 32 such that the evaporation source 3 itself can move in the vertical direction. Specifically, the strut 12 comprises a screw thread (not shown) on a lateral surface thereof and a ball screw is configured by each of the both ends of the supplying unit 32 and each of the struts 12. In other words, the entire evaporation source 3 including the supplying unit 32 can move in either one of upward and downward orientations in accordance with rotation of the strut 12. One end of the strut 12 (the lower end in the examples in FIGS. 1 and 2) is connected to a drive unit 13 that can mainly comprise a motor (not shown). The strut 12 rotating in accordance with the operation of the drive unit 13 by turning on the power moves the supplying unit 32 in either one of upward and downward orientations. Therefore, controlling the operation of the driving unit 13 makes it possible to adjust the rotational speed of the strut 12, or, in other words, the moving speed of the evaporation source 3.

The mechanism to move the evaporation source 3 is not limited to a combination of the ball screw and the drive unit 13 comprising an electric motor, so that, for example, various actuators to convert energy such as hydraulic or pneumatic pressure, or electromagnetic force into reciprocating motion can be used to move the evaporation source 3. Alternatively, a general handling robot which uses motors such as a stepping motor and/or a servomotor as a driving source and is used for a semiconductor manufacturing apparatus or a flat panel display manufacturing apparatus can be used to move the evaporation source 3. Moreover, instead of the evaporation source 3 or in addition to the evaporation source 3, the substrate holder 2 and the mask holder 4 can be moved in either one of upward and downward orientations using the same mechanism as the previously-exemplified mechanism to move the evaporation source 3. In a case of moving the entire evaporation source 3 in either one of upward and downward orientations, the air pipe 311 is formed into an expandable and contractible structure. Moreover, the evaporation source 3 can be configured such that only the supplying unit 32 can move in either one of upward and downward orientations, while the evaporation unit 31 is fixed. In that case, the supplying unit 32 and the evaporation unit 31 are connected to each other by the relay unit 33 having an expandable and contractible structure.

In the film forming apparatus 1, the vapor deposition material which has been vaporized or sublimed in the evaporation source 3 having the above-described exemplary configuration is supplied toward the surface to be vapor deposited Sa of the substrate S held by the substrate holder 2. In conjunction therewith, the evaporation source 3 (at least the supplying unit 32) relatively moves upward (or downward) relative to the substrate holder 2. By relatively moving the evaporation source 3 relative to the substrate holder 2 from the lower end portion (or the upper end portion) of the substrate S until it reaches the end portion opposite the lower end portion (or the upper end portion), a vapor deposition layer is formed on the entire surface of the surface to be vapor deposited Sa.

The substrate holder 2 can have an arbitrary structure wherein the substrate S can be held in a standing position relative to a horizontal surface at a given position within the chamber 11 with the surface to be vapor deposited Sa being oriented to a given orientation. In the example in FIG. 1, a stopper 23 for falling prevention and positioning relative to the substrate S is provided in the substrate holder 2. Moreover, an arbitrary unit to fix the substrate S to a given position of the substrate holder 2 is provided in the substrate holder 2. Furthermore, while not shown in FIGS. 1 and 2, a magnetic plate comprising either of both of a permanent magnet or an electromagnet can be provided on a surface of the substrate holder 2 opposite to a surface thereof facing the vapor deposition mask M. The magnetic plate brings the substrate S and the vapor deposition mask M that can comprise a metal frame in close contact with each other.

The substrate holder 2 is configured to hold the substrate S such that the substrate S is inclined relative to a vertical surface V in an orientation in which the upper end of the substrate S is brought to be farther away from the evaporation source 3. Therefore, the surface to be vapor deposited Sa slightly faces upward. As a result of that, a state where the vapor deposition mask M which is put onto the surface to be vapor deposited Sa and the surface to be vapor deposited Sa are in close contact with each other can be stably maintained while being assisted by gravity. The substrate S is held so as to be inclined relative to the vertical surface, therefore, the surface to be vapor deposited Sa has a given angle with the vertical surface. The angle formed by the surface to be vapor deposited Sa and the vertical surface is 3° or more, and 10° or less, and, preferably, 4° or more, and 6° or less. It is believed that, when the angle exceeds 10°, it is difficult to obtain advantages of carrying out vapor deposition with the substrate S being in a standing position with respect to the installation area of the film forming apparatus 1, while, when the above-mentioned angle is less than 3°, it is difficult to obtain the gravity action that can contribute to the close contact state between the vapor deposition mask M and the substrate S.

On the other hand, the surface to be vapor deposited Sa is inclined relative to the vertical surface, so that a distance D (below called merely "a horizontal distance D") between the supplying unit 32 of the vapor deposition source 3, and a portion of the surface to be vapor deposited Sa facing the supplying unit 32 in the horizontal direction change in accordance with movement of the evaporation source 3. Specifically, the closer the position of the vapor deposition source 3 is to the lower end of the substrate S, the shorter the horizontal distance D is, while the closer the position of the vapor deposition source 3 is to the upper end thereof, the longer the horizontal distance D is. In this way, as the horizontal distance D differs between the lower portion and the upper portion of the substrate S, the vapor deposition condition varies between the upper portion and the lower portion of the substrate S. As a result of that, the layer thickness of the vapor deposition layer to be formed can increase at a part being closer to the lower end of the substrate S and decrease at a part being closer to the upper end thereof. However, the film forming apparatus 1 according to the present embodiment comprises an adjusting instrument to decrease such a variation in layer thickness on the surface to be vapor deposited Sa based on the inclination of the substrate S (below the adjusting instrument is also called merely "a layer thickness adjusting instrument"). The film forming apparatus 1 comprises such a layer thickness adjusting instrument, making it possible to form a vapor deposition layer having high uniformity in layer thickness thereof over the entirety of the surface to be vapor deposited Sa.

The layer thickness adjusting instrument is not limited in the structure and technique thereof as long as it reduces the variation in layer thickness that can occur based on the inclination of the substrate S in forming the vapor deposition layer. In the examples in FIGS. 1 and 2, supplying amount adjusting units (a first supplying amount adjusting unit 34 and a second supplying amount adjusting unit 35) to change the supplying amount of the vapor deposition material to be supplied from the evaporation source 3, based on a relative height of the evaporation source 3 with respect to the substrate holder 2 are provided as layer thickness adjusting instruments.

The first supplying amount adjusting unit 34 is provided in the relay unit 33 of the evaporation source 3. The first supplying amount adjusting unit 34 comprising a valve to change the flow rate of the vapor deposition material in the relay unit 33, for example, changes the flow rate of the vapor deposition material in the relay unit 33. In other words, adjusting the degree of opening and closing of a valve making up the first supplying amount adjusting unit 34 changes the flow rate of the vapor deposition material flowing from the evaporation unit 31 to the supplying unit 32. As a result of that, the supplying amount of the vapor deposition material supplied from the supplying unit 32 can be adjusted.

The second supplying amount adjusting unit 35 is provided in the air pipe 311. The second supplying amount adjusting unit 35 comprises a valve to change the flow rate of a carrier gas flowing in a pipe of the air pipe 311. Adjusting the degree of opening and closing of the valve making up the second supplying amount adjusting unit 35 adjusts the flow rate of the carrier gas. As a result of that, the supplying amount and the speed at the time of supplying of the vapor deposition material from the evaporation source 3 can be adjusted. The supplying amount adjusting unit to function as a layer thickness adjusting instrument is not limited to the first supplying amount adjusting unit 34 and the second supplying amount adjusting unit 35 exemplified in FIG. 2 as long as it can adjust the flow rate of the vapor deposition material in the evaporation source 3 and the supplying amount from the evaporation source 3. The supplying amount adjusting unit can be provided at an arbitrary position in a flow passage through which the vapor deposition material passes before being supplied.

The film forming apparatus 1 according to the present embodiment can comprise, as a layer thickness adjusting instrument, a speed changing instrument to change a speed of relative movement of the evaporation source 3 in the vertical direction relative to the substrate holder 2 based on the relative height of the evaporation source 3 with respect to the substrate holder 2. In the examples in FIGS. 1 and 2, as described previously, the operation of the drive unit 13 can be controlled to adjust the moving speed of the evaporation source 3. In a case that the drive unit 13, as described previously, mainly comprises a motor, the drive unit 13 can change the rotational speed of the motor in accordance with power supplied. Therefore, the drive unit 13 can be a speed changing instrument to function as the previously-described layer thickness adjusting instrument. Moreover, a gear box (not shown) can be provided between the strut 12 and a rotary shaft of a motor making up the derive unit 13, and the speed changing instrument can be a speed changing mechanism such as the gear box. Moreover, as described previously, in a case that an actuator is used to move the evaporation source 3, this actuator can be the speed changing instrument. The speed changing instrument that can be the layer thickness adjusting instrument is not limited to these examples as long as it can change the speed of relative movement between the evaporation source 3 and the substrate holder 2 in the vertical direction, so that arbitrary mechanisms and techniques can be used.

As shown in FIG. 2, the film forming apparatus 1 further comprises a control unit 51. The degree of opening and closing of the valve making up each of the previously-described first supplying amount adjusting unit 34 and second supplying amount adjusting unit 35 can be adjusted by the control unit 51. Moreover, the operation of the drive unit 13 can be controlled by the control unit 51. In other words, in a case that the drive unit 13 mainly comprises a motor or an actuator, power supplied to the motor, or the amount of energy supplied to the actuator is controlled by the control unit 51. The control unit 51 can control the power supplied to the drive unit 13 via a power supply source (not shown). Moreover, in a case that the drive unit 13 comprises a gear box (not shown), the gear ratio of the gear box can be controlled by the control unit 51. The control unit 51 can adjust the degree of opening and closing of the valve in the first and second supplying amount adjusting units 34 and 35 and the operation of the drive unit 13 in accordance with control programs written into the control unit 51 itself or an external storage apparatus (not shown), for example. The control unit 51 can adjust them based on the operation of a user of the film forming apparatus 1. The control unit 51 can mainly comprise a semiconductor device such as a microcomputer, for example.

The control unit 51 obtains the relative height of the evaporation source 3 with respect to the substrate holder 2 from the output of a position sensor (not shown) being installed in the evaporation unit 31 and prestored position information on the substrate holder 2, for example. Then, based on the relative height, it can adjust the degree of opening and closing of the valve in the first and second supplying amount adjusting units 34 and 35 and the operation of the drive unit 13. In a case that the substrate holder 2 is provided such that it can move upward and downward, the position sensor (not shown) can preferably be installed also in the substrate holder 2. Moreover, the control unit 51 can estimate the movement distance of the evaporation source 3 and the relative height of the evaporation source 3 with respect to the substrate holder 2 based on the operation time and operation direction (for example, rotational direction of the motor) of the drive unit 13. Then, based on the estimated height, the control unit 51 can adjust the operation of each supplying amount adjusting unit and the drive unit 13.

In this way, the control unit 51 adjusts the operation of the first and second supplying amount adjusting units 34 and 35, and thereby making it possible that the first and second supplying amount adjusting units 34 and 35 change the supplying amount of the vapor deposition material to be supplied from the evaporation source 3 based on the relative height of the evaporation source 3 with respect to the substrate holder 2. Similarly, based on the relative height of the evaporation source 3 with respect to the substrate holder 2, the drive unit 13 can change the speed of relative movement of the evaporation source 3 with respect to the substrate holder 2. Each supplying amount adjusting unit and the drive unit 13 can be provided with the previously-described functions for the control unit 51.

The valve making up the first and second supplying amount adjusting units 34 and 35 has the degree of opening and closing thereof adjusted such that the supplying amount of the vapor deposition material is higher when the supplying unit 32 is positioned around the upper end portion of the substrate S than when it is positioned around the lower end portion of the substrate S. Each supplying amount adjusting unit is preferably controlled such that the supplying amount of the vapor deposition material increases linearly or in steps relative to the movement amount of the evaporation source 3 in conjunction with the relative movement upward of the evaporation source 3. Moreover, each supplying amount adjusting unit is preferably controlled such that the supplying amount of the vapor deposition material decreases linearly or in steps relative to the movement amount of the evaporation source 3 in conjunction with the relative movement downward of the evaporation source 3.

The speed changing instrument to function as the layer thickness adjusting instrument is controlled such that the speed of relative movement of the evaporation source 3 is lower when the supplying unit 32 is positioned around the upper end portion of the substrate S than when it is positioned around the lower end portion of the substrate S. This speed changing instrument is preferably controlled such that the speed of relative movement of the evaporation source 3 decreases linearly or in steps relative to the movement amount of the evaporation source 3 in conjunction with the relative movement upward of the evaporation source 3. Moreover, the speed changing instrument is preferably controlled such that the speed of relative movement of the evaporation source 3 increases linearly or in steps relative to the movement amount of the evaporation source 3 in conjunction with the relative movement downward of the evaporation source 3.

The film forming apparatus 1 can further comprise a moving instrument with respect to one or both of the evaporation source 3 and the substrate holder 2. The moving instrument brings the evaporation source 3 and the substrate S being held by the substrate holder 2 closer to or farther away from each other in the horizontal direction (+X and −X orientations in FIG. 1). In the example in FIG. 1, a moving instrument 14a with respect to the evaporation source 3 and a moving instrument 14b with respect to the substrate holder 2 are provided (in FIG. 2, the moving instruments 14a and 14b are omitted for ease of viewing). The moving instrument 14a for the evaporation source 3 moves the evaporation source 3 together with the drive unit 13 and the strut 12 in a direction (+X orientation and −X orientation in FIG. 1) being orthogonal to the surface to be vapor deposited Sa of the substrate S held by the second holder 2 without inclination relative to the vertical surface. The moving instrument 14b moves the substrate holder 2 together with the mask holder 4 in the +X orientation and −X orientation in FIG. 1. As described previously with respect to movement of the evaporation source 3 in the upward and downward orientations, the moving instruments 14a and 14b being schematically shown in FIG. 1 can comprise a combination a motor and a ball screw, or various actuators. However, the moving instruments 14a, 14b can be an arbitrary mechanism that can move the evaporation source 3 and/or the substrate holder 2 in the horizontal direction.

The operation of the moving instruments 14a, 14b can be controlled by the control unit 51 (see FIG. 2). Therefore, the moving instruments 14a, 14b can bring the substrate S being held by the substrate holder 2 and the evaporation source 3 closer to or farther away from each other based on the relative height of the evaporation source 3 with respect to the substrate holder 2. The film forming apparatus 1 can comprise such moving instruments 14a, 14b as a layer thickness adjusting instrument. The moving instruments 14a, 14b does not necessarily have to be controlled by the control unit 51 and can be provided with functions of the control unit 51.

The moving instruments 14a, 14b bring the evaporation source 3 and the substrate S closer to each other when the supplying unit 32 is positioned around the upper end portion than when it is positioned around the lower end portion of the substrate S. The moving instruments 14a, 14b preferably bring the evaporation source 3 and the substrate S closer to each other in the horizontal direction linearly or in steps relative to the movement amount of the evaporation source 3 in conjunction with the relative movement upward of the evaporation source 3. Moreover, the moving instruments 14a, 14b preferably bring the evaporation source 3 and the substrate S farther away from each other in the horizontal direction linearly or in steps with respect to the movement amount of the evaporation source 3 in conjunction with the relative movement downward of the evaporation source 3. More preferably, the moving instruments 14a, 14b bring the substrate holder 2 and the evaporation source 3 closer to or farther away from each other such that the horizontal distance D is substantially constant from when the supplying unit 32 is at an upper end portion or a lower end portion of the substrate S to when the supplying unit 32 reaches the end portion opposite the upper end portion or the lower end portion of the substrate S in the relative movement of the evaporation source 3 with respect to the substrate holder 2.

Figure 3:
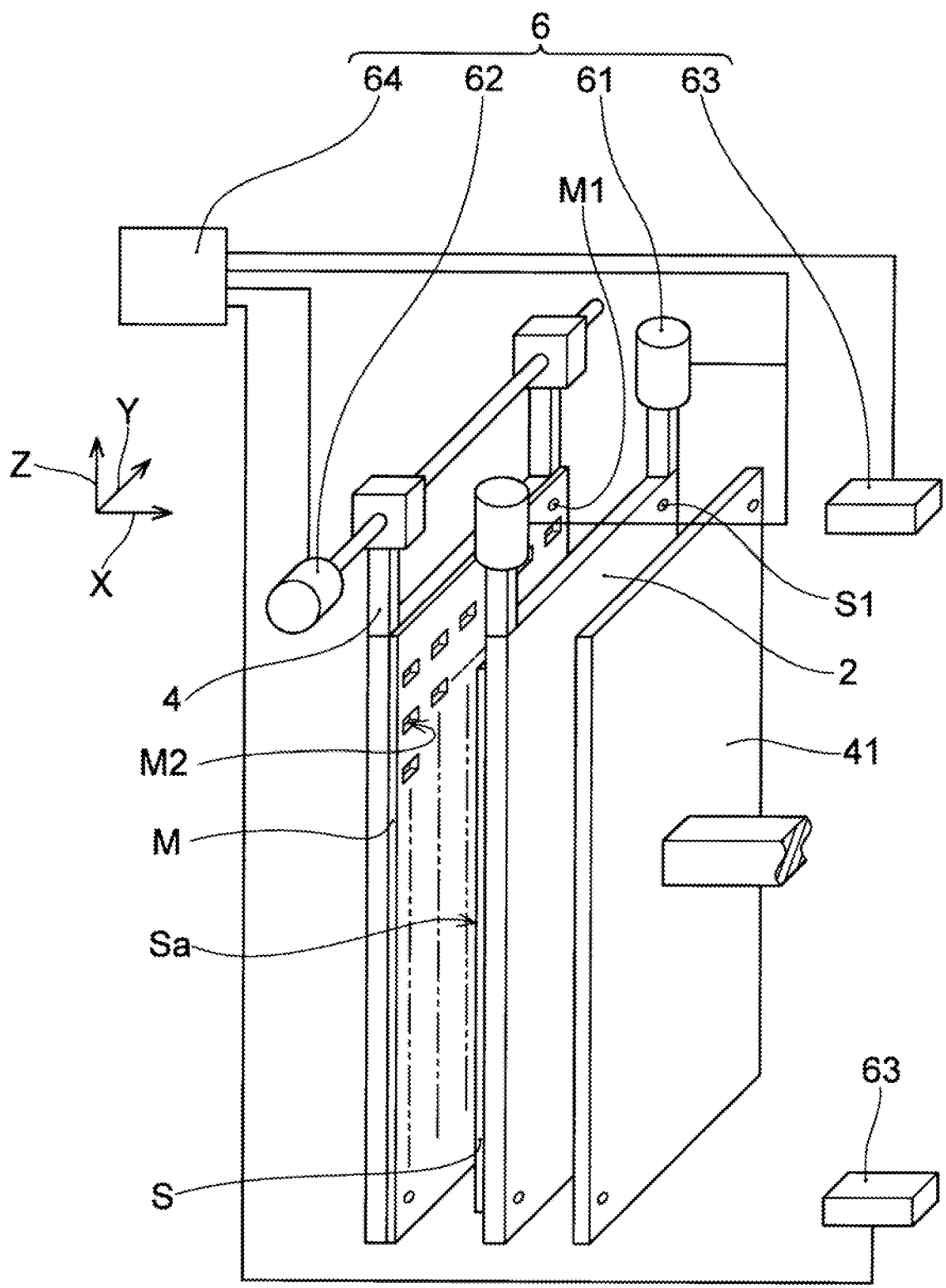
FIG. 3 shows a diagram of one example of an alignment unit in the film forming apparatus according to one embodiment.

While not shown in FIGS. 1 and 2, the film forming apparatus 1 can comprise a mechanism for alignment of the vapor deposition mask M and the substrate S. FIG. 3 shows an alignment unit 6 being one example of such a mechanism for alignment. The alignment of the vapor deposition mask M held by the mask holder 4 and the substrate S held by the substrate holder 2 is carried out by the alignment unit 6. The alignment unit 6 exemplified in FIG. 3 comprises a vertical direction adjusting unit 61, a horizontal direction adjusting unit 62, a camera 63, and an alignment control unit 64. The vertical direction adjusting unit 61 moves the substrate holder 2 in the vertical direction (Z direction in the example in FIG. 3) being orthogonal to the direction (X direction in FIG. 3) in which the substrate S and the vapor deposition mask M face each other, while the horizontal direction adjusting unit 62 moves the mask holder 4 in the horizontal direction (Y direction in FIG. 3) being orthogonal to X and Z directions. The vertical direction adjusting unit 61 and the horizontal direction adjusting unit 62 can comprise an arbitrary actuator or motor in a manner similar to the moving instrument 14a with respect to the evaporation source 3 as described previously, for example. The substrate holder 2 and the mask holder 4 can be fixed to the chamber 11 (see FIGS. 1 and 2) via these adjusting units 61 and 62 for respective directions.

The camera 63 takes an image of a marks M1, S1 provided in the vapor deposition mask M and the substrate S, or an image of a compartment (not shown) for each pixel formed on the substrate S and an aperture M2 being formed in the vapor deposition mask M. Based on the image taken by the camera 63, the alignment control unit 64 causes the vertical direction adjusting unit 61 and the horizontal direction adjusting unit 62 to move the substrate holder 2 and the mask holder 4 such that the mark M1 and the mark S1 are superimposed, and thereby executing the alignment, for example. Thereafter, the vapor deposition mask M is put onto the surface to be vapor deposited Sa. Then, in the example in FIG. 3, by a magnetic plate 41 being provided on a surface of the substrate holder 2 opposite to its surface facing the vapor deposition mask M, the vapor deposition mask M comprising a metal frame is attracted and the vapor deposition mask M and the substrate S are brought into close contact with each other. The alignment control unit 64, and the control unit 51 exemplified in FIG. 2 are preferably configured such that they operate in cooperation with each other. For example, the operation of the alignment unit 6 can be controlled by the control unit 51. The configuration of the alignment unit 6 is not limited to the configuration shown in FIG. 3. For example, both the vertical direction adjusting unit 61 and the horizontal direction adjusting unit 62 can be provided in either or both of the substrate holder 2 and the mask holder 4.

In the previously-referred example in FIGS. 1 and 2, the substrate holder 2 comprises first holding unit 21 and second holding unit 22. In this case, the alignment unit 6 executes the alignment with respect to the vapor deposition mask M for each of the substrates S held by the two holding units. Preferably, the alignment unit 6 is provided for each of the substrates S held by the two holding units.

In the chamber 11, there are two areas, in each of which two areas, alignment between the substrate S and the vapor deposition mask M is executed and a vapor deposition layer is formed using the evaporation source 3. As the examples in FIGS. 1 and 2, one evaporation source 3 can be shared between the two areas. In each of the areas, alignment of the substrate S is carried out in accordance with the previously-described procedure and, thereafter, film forming is executed. Preferably, while vapor deposition is carried out in one area, alignment is carried out in the other area. In this way, continuously carrying out vapor deposition in an alternate manner between two areas allows forming a vapor deposition layer efficiently. Moreover, the evaporation source 3 comprises nozzles (first nozzle 321 and second nozzle 322) facing the respective areas and, preferably, a nozzle to actually supply the vapor deposition material is switched as needed.

Figure 4B:
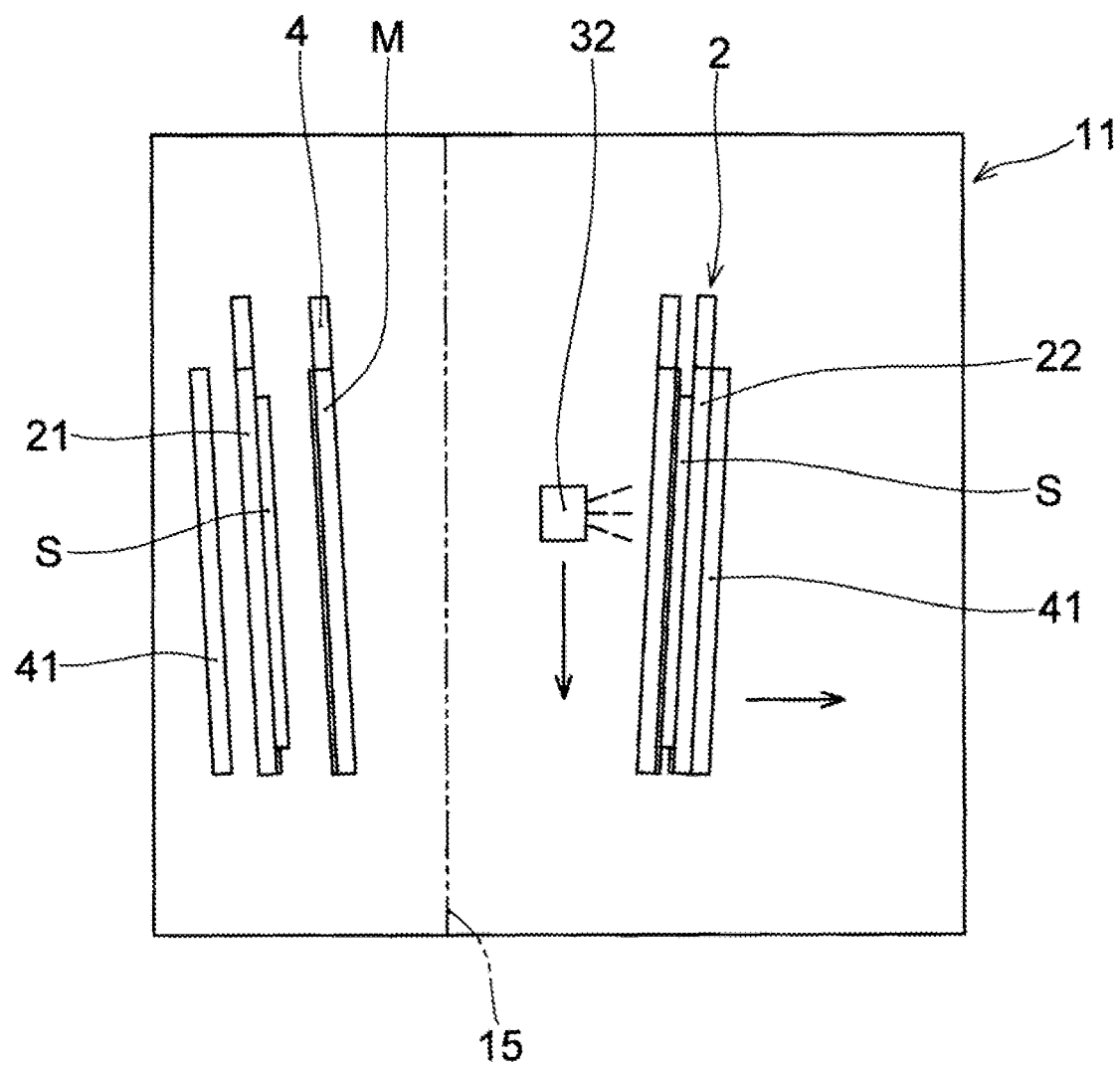
FIG. 4B shows a diagram of one example of the operation of the film forming apparatus according to one embodiment.

With reference to FIGS. 4A and 4B, an example of an operation at the time of forming a vapor deposition layer onto each substrate S in the film forming apparatus 1 in which the two substrates S are held as in the example such as in FIG. 1 is described. FIG. 4A schematically shows a process in which the vapor deposition material is supplied onto the substrate S held by the first holding unit 21 on the left, while FIG. 4B schematically shows a process in which the vapor deposition material is supplied onto the substrate S being held by the second holding unit 22 on the right. In FIGS. 4A and 4B, the strut 12, the drive unit 13, the moving instruments 14a, 14b, constituting elements of the evaporation source 3 other than the supplying unit 32, and the control unit 51 are omitted.

In the process shown in FIG. 4A, the supplying unit 32 of the evaporation source 3 (see FIG. 1) supplies the vapor deposition material onto the substrate S being held by the first holding unit 21 while carrying out a relative movement upward relative to the substrate holder 2. On the other hand, in the process shown in FIG. 4B, the supplying unit 32 of the evaporation source 3 supplies the vapor deposition material onto the substrate S being held by the second holding unit 22 while carrying out a relative movement downward relative to the substrate holder 2. In other words, the evaporation source 3 moves upward (in a first orientation) relative to the substrate holder 2 when the evaporation source 3 supplies the vapor deposition material toward the substrate S being held by the first holding unit 21, while the evaporation source 3 moves in an orientation opposite the first orientation with respect to the vertical direction (i.e., downward orientation) relative to the substrate holder 2 when the evaporation source supplies the vapor deposition material toward the substrate S being held by the second holding unit 22.

In this way, the vapor deposition material can be supplied to either one of the two substrates S in a relative movement in either of upward and downward orientations to efficiently form a vapor deposition layer. In the relative movement upward or downward, the evaporation source 3 can simultaneously supply the vapor deposition material to both substrates S. However, after moving in one orientation with supplying the vapor deposition material, a waiting time can occur for changing the substrates S before moving in an orientation opposite the one orientation. Therefore, such a manner of supplying is not necessarily efficient. Moreover, while it is preferable to stop supplying of the vapor deposition material during the waiting time from the viewpoint of preventing waste of the vapor deposition material, in such a case, there is a likelihood of unevenness occurring in layer thickness as the supplying amount becomes unstable at the beginning of the restarted supplying. Moreover, to supply the vapor deposition material toward the two substrates S simultaneously, the amount of vapor deposition material to be vaporized or sublimed in a unit time in the evaporation unit 31 (see FIG. 1) increases, possibly causing more energy to be needed. Therefore, it is preferable to continuously supply the vapor deposition material while reducing waste by supplying the vapor deposition material as in the examples of FIGS. 4A and 4B.

In each of the vapor deposition processes shown in FIGS. 4A and 4B, a variation in thickness of the vapor deposition layer to be formed is reduced by the previously-described layer thickness adjusting instrument. For example, in the process shown in FIG. 4A, the supplying amount from the supplying unit 32 is gradually increased by the first supplying amount adjusting unit 34 and the second supplying amount adjusting unit 35. Moreover, the speed of relative movement of the supplying unit 32 can be decreased gradually by the drive unit 13 (see FIG. 2). Moreover, the supplying unit 32 and the substrate S can be brought closer to each other (see arrow A in FIG. 4A) in the horizontal direction by the moving instruments 14a, 14b (see FIG. 1). On the other hand, in the vapor deposition process shown in FIG. 4B, adjusting is carried out in a direction opposite to adjusting by the layer thickness adjusting instrument in the vapor deposition process in FIG. 4A thereby reducing a variation in thickness of the vapor deposition layer.

In the example shown in FIGS. 4A and 4B, alignment is carried out by the alignment unit 6 (see FIG. 3) in the substrate S onto which the vapor deposition material is not supplied while the vapor deposition material is supplied toward the substrate S held by either one of the first holding unit 21 and the second holding unit 22. In other words, during supplying of the vapor deposition material onto the substrate S held by one holding unit, the substrate S which has been held by the other holding unit and on which the vapor deposition layer has been already formed is brought farther away from the supplying unit 32 (the evaporation source 3) along with the vapor deposition mask M and pulled away from the vapor deposition mask M along with the magnetic plate 41. Then, instead of the substrate S, a new substrate S is introduced in the chamber 11, alignment for the new substrate S with the vapor deposition mask M is executed, and the new substrate S and the vapor deposition mask M are brought into close contact with each other using the magnetic plate 41. In this way, carrying out supplying of the vapor deposition material onto one of the two substrates S and preparing of vapor deposition for the other substrate S in parallel makes it possible to reduce the waiting time of the evaporation source 3 and more efficiently form the vapor deposition layer. In the film forming apparatus 1, as described previously, the control unit 51 (see FIG. 1) to control the drive unit 13, and the alignment control unit 64 can be configured such that they cooperate with each other. Therefore, execution of alignment between the vapor deposition mask M and the substrate S that is in conjunction with supplying of the vapor deposition material as shown in FIGS. 4A and 4B can also be possible.

In the examples in FIGS. 4A and 4B, a shielding body 15 is provided between the supplying unit 32 (the evaporation source 3), and the substrate S and the vapor deposition mask M for which alignment is carried out. In other words, a partition is provided by the shielding body 15 between a vapor deposition area in which supplying of the vapor deposition material is carried out and an area in which alignment between the substrate S and the vapor deposition mask is carried out so that the interior of the chamber 11 is partitioned into two areas. Therefore, unintended sticking of the vapor deposition material onto the substrate S during alignment can be prevented. The shielding body 15 can comprise an arbitrary movable member such as a windable shutter or roll screen, for example.

Figure 5A:
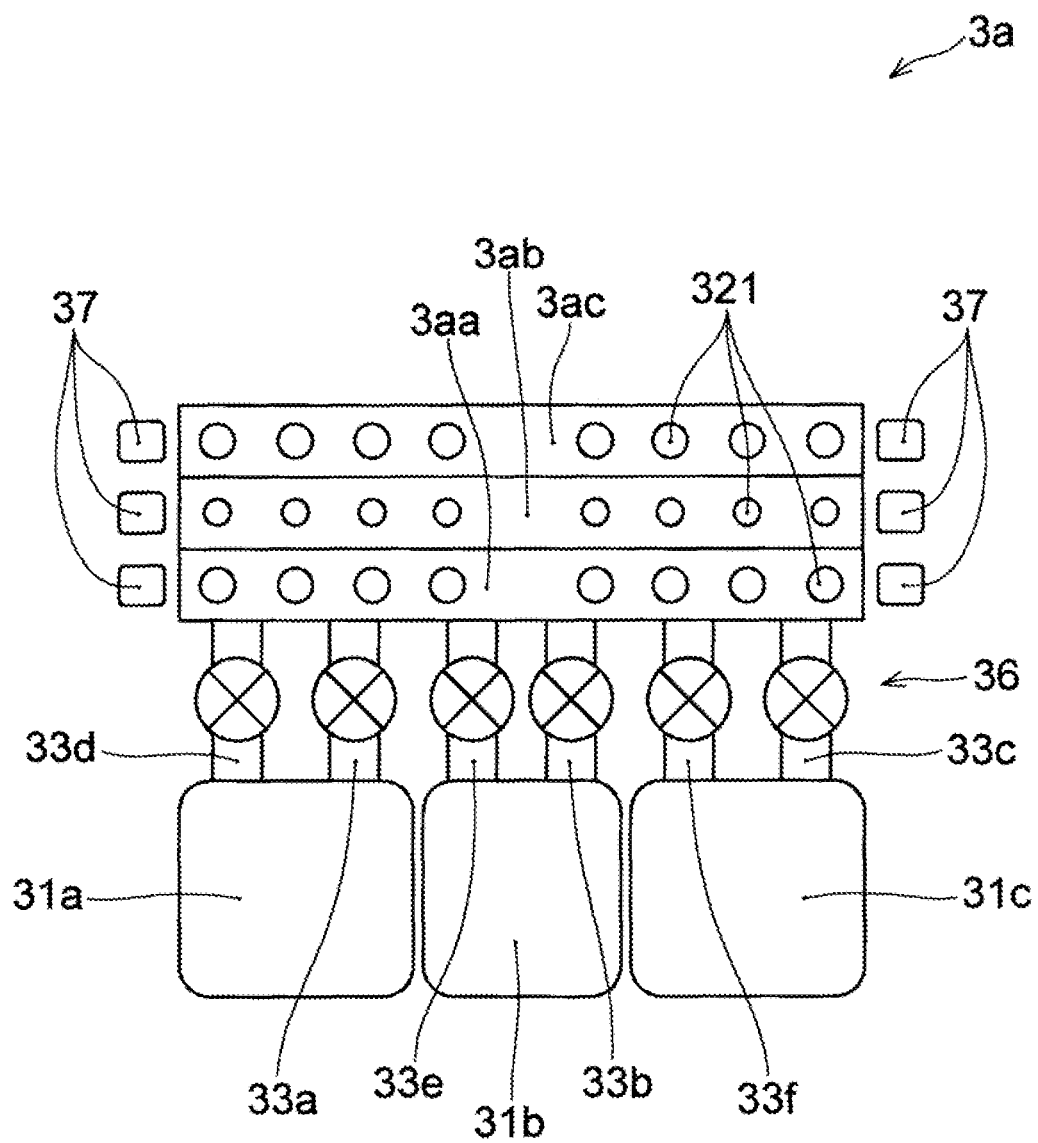
FIG. 5A shows a front view of another example of an evaporation source in the film forming apparatus according to one embodiment.
Figure 5B:
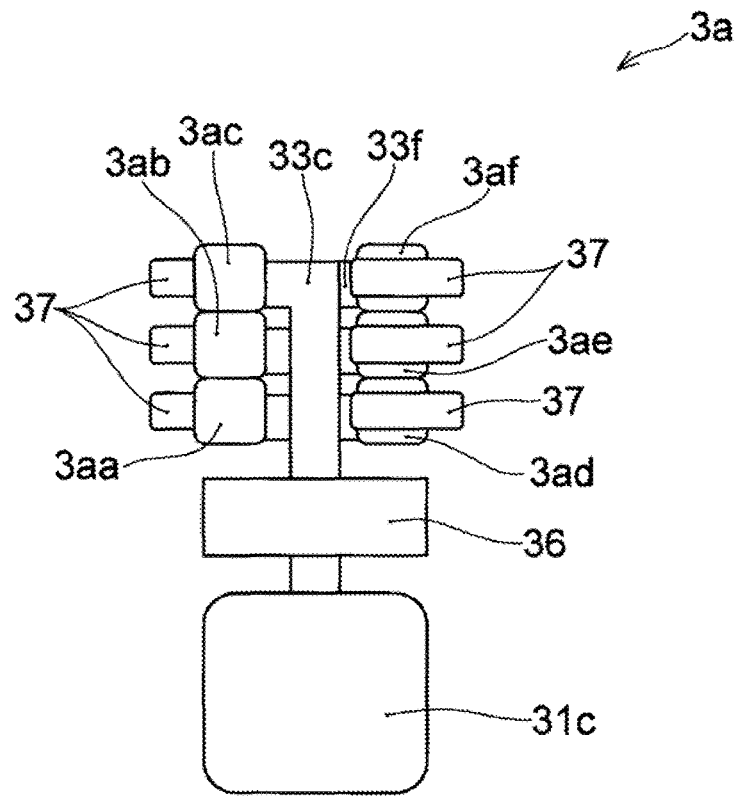
FIG. 5B shows a lateral view of the evaporation source in FIG. 5A.
Figure 5C:
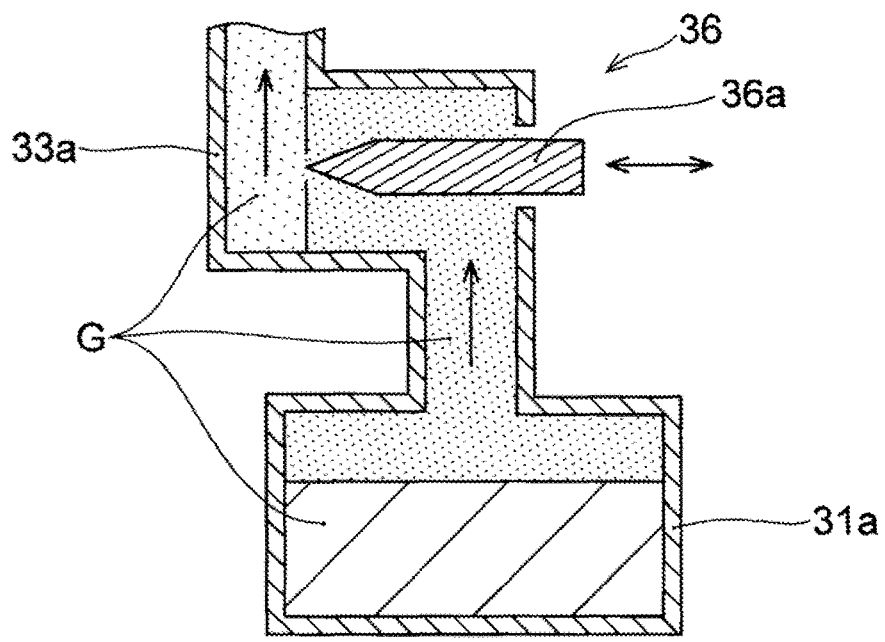
FIG. 5C schematically shows the interior of a valve unit and an evaporation unit of the evaporation source in FIG. 5A.

In a case that the vapor deposition materials is supplied onto the two substrates S one by one which are held by opposite sides of the evaporation source 3 as shown in FIGS. 4A and 4B, the evaporation source 3 preferably has a structure in which supplying from nozzles each being oriented to each of the two substrates S can be switched as needed. In other words, the evaporation source 3 can preferably control supplying of the vapor deposition material and stopping thereof for each of the nozzles being oriented to the two respective substrates S. In this way, waste of the vapor deposition material can be suppressed. In FIGS. 5A to 5C, an evaporation source 3a being one example of such an evaporation source is schematically shown. FIG. 5A shows the evaporation source 3a in the lateral view of the film forming apparatus 1 in the same manner as FIG. 2, while FIG. 5B shows the evaporation source 3a in the front view of the film forming apparatus 1 in the same manner as FIG. 1. FIG. 5C schematically shows the internal structure of an evaporation unit (crucible) 31a and a valve unit 36. The examples in FIGS. 5A to 5C are examples of the evaporation source 3a not using the carrier gas, so that the air pipe 311 shown in FIGS. 1 and 2 is not provided. Therefore, the evaporation source 3a can be realized in a simple structure.

As shown in FIGS. 5A and 5B, the evaporation source 3a comprises three evaporation units (crucibles) 31a to 31c, and six supplying units (nozzle units) 3aa to 3af. The supplying units 3aa to 3ac are oriented to the first holding unit 21 (see FIG. 1) of the substrate holder 2, for example, while the supplying units 3ad to 3af are oriented to the second holding unit 22 (see FIG. 1), for example. In the supplying units 3aa to 3ac, with the supplying unit 3aa being the lowermost layer, the supplying unit 3ab is stacked with the supplying unit 3aa, and furthermore the supplying unit 3ac is stacked. Similarly, with the supplying unit 3ad being the lowermost layer, the supplying unit 3ae is stacked with the supplying unit 3ad, and furthermore the supplying unit 3af is stacked. Each of the supplying units 3aa to 3ac comprises a plurality of first nozzles 321 being opened toward the substrate S (see FIG. 1) held by the first holding unit 21. Moreover, while not shown in FIG. 5A, each of the supplying units 3ad to 3af comprises a plurality of second nozzles 322 (see FIG. 2) being opened toward the substrate S held by the second holding unit 22. Each of the first nozzles 321 and the second nozzles 322 has a diameter thereof designed while considering the uniformity of thickness in the vapor deposition layer to be formed on the substrate S. In the example of FIG. 5A, the first nozzle 321 in the supplying unit 3ab positioned in the middle layer has a diameter thereof being smaller than that of the first nozzle 321 in each of the supplying unit 3aa positioned in the lower layer and the supplying unit 3ac positioned in the upper layer. While not shown, the second nozzle 322 in the supplying unit 3ae has a diameter thereof being smaller than that of the second nozzle 322 in each of the supplying unit 3ad and the supplying unit 3af. Setting such diameters of nozzles makes it possible to simplify forming of the vapor deposition layers being uniform in layer thickness.

Each of the plurality of evaporation units 31a to 31c is connected to two of the plurality of supplying units 3aa to 3af via two of the plurality of relay tubes 33a to 33f. Specifically, the evaporation unit 31a is connected to the supplying unit 3aa of the lower layer via the relay tube 33a and similarly to the supplying unit 3ad of the lower layer via the relay tube 33d. Moreover, the evaporation unit 31b is connected to the supplying unit 3ab of the middle layer via the relay tube 33b and similarly to the supplying unit 3ae of the middle layer via the relay tube 33e. Furthermore, the evaporation unit 31c is connected to the supplying unit 3ac of the upper layer via the relay tube 33c and similarly to the supplying unit 3af of the upper layer via the relay tube 33f. A valve unit 36 is provided in each of the relay tubes. Moreover, a detector 37 to monitor the supplying amount of the vapor deposition material from each of the supplying units is provided laterally with respect to each of the supplying units. The detector 37 comprises an imaging apparatus comprising a CCD, or an image processing device, for example. However, the detector 37 can have an arbitrary configuration. The evaporation units 31a to 31c, supplying units 3aa to 3af, the relay tubes 33a to 33f, valve unit 36, and detector 37 integrally move in vertical direction relative to the substrate holder 2 (see FIG. 1), for example, and a vapor deposition layer is formed on the entire surface of the substrate S.

The valve unit 36 can function as a layer thickness adjusting instrument in the same manner as the first supplying amount adjusting unit 34 in the examples in FIGS. 1 and 2. In other words, the supplying amount of the vapor deposition material being supplied from each of the supplying units 3aa to 3af is adjusted by the valve unit 36. Preferably, detected results of the detector 47 are used to adjust the supplying amount. As shown in FIG. 5C, the valve unit 36 comprises a valve 36a to block an air hole provided in a relay tube (exemplified by the relay tube 33a in FIG. 5C). A vapor deposition material G is housed in the evaporation unit (crucible) 31a and the flow rate of the vapor deposition material G being heated in the crucible to be vaporized and sublimed and heading for the supplying unit 3aa or the like is adjusted by controlling the degree of opening and closing of the valve 36a. While not shown, the value 36a, for example, is connected to the control unit 51 (see FIG. 2) and the degree of opening and closing of the valve 36a is controlled by the control unit 51. Moreover, a heater (not shown) to generate joule heat, for example, is provided in the surrounding of the crucible and in the surrounding of the valve unit 36 and each relay tube. Heating the valve unit 36 and each relay tube, preferably to a temperature higher than that of the crucible makes it possible to prevent sticking of the vapor deposition material G onto an inner wall of each relay tube and the valve 36a.

Moreover, when the vapor deposition material is supplied from the supplying units 3aa to 3ac toward the substrate S held by the first holding unit 21 (see FIG. 1) of the substrate holder 2, for example, the relay tubes 33d to 33f are blocked by the valve 36a. As a result, supplying of the vapor deposition material from the second nozzle 322 (see FIG. 1) is stopped. Then, when the vapor deposition material is supplied from the supplying units 3ad to 3af toward the substrate S held by the second holding unit 22 (see FIG. 1) of the substrate holder 2, for example, the relay tubes 33a to 33c are blocked by the value 36a and supplying of the vapor deposition material from the first nozzle 321 is stopped. In this way, the evaporation source 3a comprises a member (valve 36a) to stop supplying from the first nozzle 321 when the vapor deposition material is to be supplied from the second nozzle 322 and a member (valve 36a) to stop supplying from the second nozzle 322 when the vapor deposition material is to be supplied from the first nozzle 321. As the evaporation source 3a, an evaporation source having a structure to switch, as needed, supplying from the first nozzle 321 and the second nozzle 322 and an evaporation source not using a carrier gas does not have to comprise a supplying unit with a three-layer structure and/or three evaporation units (crucibles) such as the examples in FIG. 5A and the like. In other words, even in these evaporation sources, an arbitrary number of crucibles and supplying units can be provided.

The film forming apparatus 1, unlike the example in FIG. 1, can comprise the substrate holder 2 to hold only one substrate S. In this case, it suffices that the mask holder 4 be configured to be capable of holding one vapor deposition mask M and that the vapor deposition source 3 comprise a nozzle to supply the vapor deposition material toward the one substrate S.

(Method of Forming a Vapor Deposition Layer)

Herein below, a method of forming a vapor deposition layer according to second embodiment is explained with reference to each of the previously-referred drawings again with a case of film formation using a film forming apparatus 1 according to the first embodiment as an example. As shown in FIGS. 1 and 2, the method of forming a vapor deposition layer according to the present embodiment comprises: arranging, in a vapor deposition apparatus (a film forming apparatus 1), a substrate S in a standing position relative to a horizontal surface, the substrate S comprising a surface to be vapor deposited Sa on which a vapor deposition layer is to be formed; and depositing a vapor deposition material onto the surface to be vapor deposited Sa by supplying the vapor deposition material from an evaporation source 3 being provided in a region toward which the surface to be vapor deposited Sa of the substrate S is oriented, while causing the evaporation source 3 to carry out a relative movement in at least either one of upward and downward orientations relative to the substrate S. In the method of forming a vapor deposition layer according to the present embodiment, at the time of supplying the vapor deposition material, the substrate S is held with an inclination relative to a vertical surface such that an upper end of the substrate S is brought to be farther away from the evaporation source 3. Then, the vapor deposition material is deposited while a variation in a thickness of the vapor deposition layer is decreased by compensating for a difference, based on the inclination of the substrate S, in vapor deposition efficiency within the surface to be vapor deposited Sa. Specific examples of each of the steps are shown below.

First, using a handling robot (not shown), for example, the substrate S is carried into the chamber 11 being exhausted into high vacuum (approximately $10^{-3}$ Pa to $10^{-4}$ Pa), the substrate S is held by the substrate holder 2, and then arranged in the chamber 11 in a standing position relative to a horizontal surface. In the method of forming a vapor deposition layer according to the present embodiment, two substrates S (a first substrate and a second substrate) can be arranged in the chamber 11 such that respective surfaces to be vapor deposited Sa of the two substrate S face each other and the vapor deposition material can be supplied while the evaporation source 3 carries out the relative movement relative to the two substrates S between the two substrates S. In this way, the vapor deposition layer can be formed efficiently onto the two substrates S. Moreover, in forming an organic layer making up a light-emitting layer in the organic-EL display apparatus, a vapor deposition mask M comprising a given aperture is used, so that, in that case, the method of forming a vapor deposition layer according to the present embodiment can comprise aligning the vapor deposition mask M and the substrate S, and arranging the vapor deposition mask M and the substrate S so as to overlap each other. In the explanations below, as in the examples in FIGS. 1 and 2, the method of forming a vapor deposition layer according to the present embodiment is explained with a case in which the two substrates S are arranged in the vapor deposition apparatus and the vapor deposition mask M is used as an example. However, in the method of forming a vapor deposition layer according to the present embodiment, only one substrate S can be arranged in the vapor deposition apparatus. Moreover, the method of forming a vapor deposition layer according to the present embodiment is also effective in a case of not using a vapor deposition mask, for example, forming a vapor deposition layer (non-selectively) on the entirety of the surface to be vapor deposited Sa.

The vapor deposition mask M and the substrate S are aligned using an alignment unit 6 (see FIG. 3) as described previously, for example. Thereafter, the vapor deposition mask M is put onto the surface to be vapor deposited Sa, and the vapor deposition mask M and the substrate S are brought into close contact with each other using, for example, a magnetic plate 41. The substrate S is caused to be inclined relative to the vertical surface such that the upper end of the substrate S is brought farther away from the evaporation source 3 at an arbitrary timing until the start of supplying the vapor deposition material after the substrate S is introduced into the chamber 11. The substrate S is caused to be inclined relative to the vertical surface such that the surface to be vapor deposited Sa and the vertical surface form an angle, for example, 3° or more and 10° or less, preferably 4° or more and 6° or less.

As shown in FIGS. 4A and 4B, the vapor deposition material is supplied toward the substrate S from the supplying unit 32 of the evaporation source as shown in FIGS. 4A and 4B. The vapor deposition material being solid supplied to a crucible (not shown) in the evaporation source 3 (see FIG. 1) is heated to be vaporized or sublimed, and supplied from the supplying unit 32. The evaporation source 3 is caused to carry out a relative movement in at least either one of upward and downward orientations relative to the substrate S while supplying the vapor deposition material. In a case that the vapor deposition layer is formed in the film forming apparatus 1 exemplified in FIGS. 1 and 2, the drive unit 13 can be operated to cause the evaporation source 3 to carry out a relative movement in either one of upward and downward orientations with respect to the substrate S. Such supplying of the vapor deposition material and movement of the evaporation source 3 causes the vapor deposition material to be deposited onto the surface to be vapor deposited Sa, as a result of that, the vapor deposition layer is formed onto the surface to be vapor deposited Sa. Unlike the examples in FIGS. 1 and 2, the substrate holder 2 can be moved in either one of upward and downward orientations to cause the evaporation source 3 to carry out a relative movement with respect to the substrate holder 2. Alternatively, both of the substrate holder 2 and the evaporation source 3 can be moved to cause the evaporation source 3 to carry out a relative movement with respect to the substrate holder 2.

In the method of forming a vapor deposition layer according to the present embodiment, the difference in vapor deposition efficiency at the surface to be vapor deposited Sa in conjunction with the substrate S being held in an inclined position with respect to the vertical surface is compensated to cause the vapor deposition material to be deposited while reducing a variation in a thickness of the vapor deposition layer. In other words, as the surface to be vapor deposited Sa is inclined with respect to the vertical surface, the previously-described horizontal distance D (see FIG. 1) differs between the upper portion and the lower portion of the substrate S, under the influence of that, a difference in vapor deposition efficiency occurs between the upper portion and the lower portion of the substrate S. As a result, the thickness of the vapor deposition layer to be formed varies between the lower portion and the upper portion of the substrate S. Normally, the thickness of the vapor deposition layer increases toward the lower portion in which the horizontal distance D is short and decreases toward the upper portion in which the horizontal distance D is long. The layer forming method according to the present embodiment comprises compensating for this difference in the vapor deposition efficiency.

The method of compensating for the difference in the vapor deposition efficiency is not particularly limited as long as it can result in a decreased variance in thickness of the vapor deposition layer, but a method of adjusting layer thickness as described with respect to the layer thickness adjusting instrument in the previously-described explanation of the film forming apparatus 1 according to the first embodiment can be used. In other words, the difference in the vapor deposition efficiency can be compensated by changing the supplying amount of the vapor deposition material from the evaporation source 3 based on the relative height of the evaporation source 3 with respect to the substrate S. In a case that the film forming apparatus 1 of the first embodiment is used, either or both the first supplying amount adjusting unit 34 and the second supplying amount adjusting unit 35 can be adjusted to adjust the supplying amount of the vapor deposition material from the evaporation source 3. However, the method of adjusting the supplying amount of the vapor deposition material from the evaporation source 3 is not limited to adjusting the first supplying amount adjusting unit 34 and the second supplying amount adjusting unit 35. For example, the temperature of the crucible in the evaporation source 3 can be changed to change the amount of vapor deposition material to be vaporized or sublimed in a unit time.

Moreover, the speed of relative movement of the evaporation source 3 with respect to the substrate S can be changed based on the relative height of the evaporation source 3 with respect to the substrate S to compensate for the difference in the vapor deposition efficiency. For example, the drive unit 13 in the film forming apparatus 1 being exemplified in FIG. 2 can be controlled based on the relative height of the evaporation source 3 with respect to the substrate S to change the speed of relative movement of the evaporation source 3. The speed of relative movement of the evaporation source 3 can be changed by controlling an arbitrary drive source moving the evaporation source 3 such as various actuators. Moreover, in a case that the substrate S is held movable in the vertical direction, the moving speed of the substrate S can be changed based on the relative height of the evaporation source 3 with respect to the substrate S to change the speed of relative movement of the evaporation source 3.

Moreover, the substrate S and the evaporation source 3 can be brought closer to or farther away from each other in the horizontal direction based on the relative height of the evaporation source 3 with respect to the substrate S to compensate for the difference in the vapor deposition efficiency. For example, either or both of the substrate S and the evaporation source 3 can be brought closer to or farther away from each other in the horizontal direction using an arbitrary unit allowing either or both of the substrate S and the evaporation source 3 to be moved in the horizontal direction, such as the moving instruments 14*a*, 14*b* in the film forming apparatus 1 shown in FIG. 1. When the evaporation source 3 is positioned around the lower end portion of the substrate S, the substrate S and the evaporation source 3 are brought farther away from each other in the horizontal direction compared to when the evaporation source 3 is positioned around the upper end portion of the substrate S. Then, when the evaporation source 3 is positioned around the upper end portion of the substrate S, the substrate S and the evaporation source S are brought closer to each other in the horizontal direction compared to when the evaporation source 3 is positioned around the lower end portion of the substrate S. While the evaporation source 3 moves from the lower end portion or the upper end portion of the substrate S to the opposite end portion thereof, it is preferable that the substrate S and the evaporation source 3 be brought closer to or farther away from each other in accordance with the relative height of the evaporation source 3 with respect to the substrate S such that the horizontal distance D (see FIG. 1) is kept almost constant.

Figure 6A:
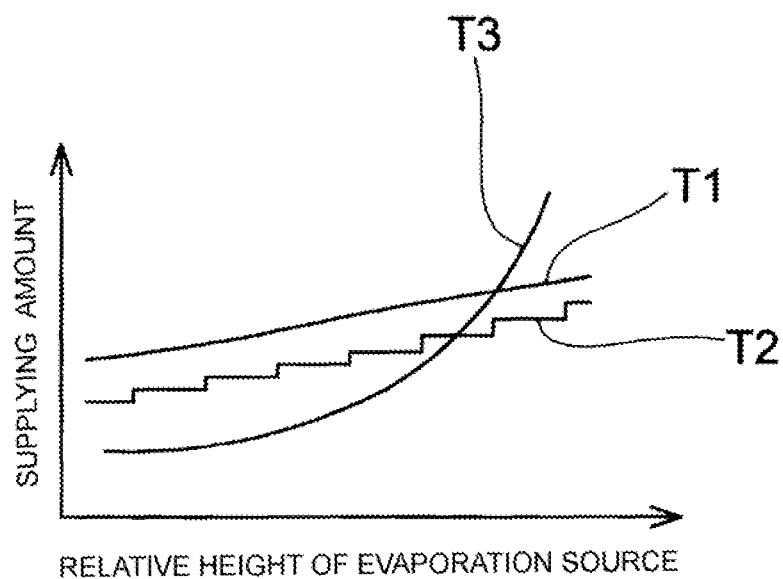
FIG. 6A shows a diagram of one example of a way to suppress layer thickness variation in a method of forming a film according to one embodiment.

FIG. 6A shows one example of a supplying amount adjusting method in a case that a layer thickness variation is suppressed by changing the supplying amount of the vapor deposition material. The horizontal axis in FIG. 6A shows the relative height of the evaporation source 3 with respect to the substrate S, while the vertical axis therein shows the supplying amount of the vapor deposition material. The three lines respectively marked with symbols T1 to T3 as shown in FIG. 6A show changes in the supplying amount being adjusted in accordance with the height of the evaporation source 3. The higher the position of the evaporation source 3 is, the longer the horizontal distance D (see FIG. 1) between the evaporation source 3 and the vapor deposition surface Sa is, and the vapor deposition efficiency decreases, therefore, in any of the supplying amount changes T1 to T3, the supplying amount increases as the height of the evaporation source 3 increases.

In the supplying amount change T1, the supplying amount is increased linearly in conjunction with a rise in the evaporation source 3. In the supplying amount change T2, the supplying amount is gradually increased. In such a gradual adjustment, control can be easier than in a case that the supplying amount is linearly adjusted. Moreover, in the supplying amount change T3, the greater the height of the evaporation source 3 is, the greater the rate of increase in the supplying amount is, so that the change in the supplying amount is depicted by a curve in FIG. 6A. In a case of the rate of change of the layer thickness being less in conjunction with the rise of the evaporation source 3, it is preferable that the rate of increase in the supplying amount is increased as well in conjunction with the rise of the evaporation source 3. Moreover, it is more preferable that the supplying amount of the vapor deposition material be changed based on the height of the evaporation source 3 and the relationship between the supplying amount and the layer thickness such that the change in layer thickness according to the height of the evaporation source 3 in a case that suppressing of the layer thickness variation is not carried out as in the present embodiment is canceled out. However, the mode of change of the supplying amount based on the relative height of the evaporation source 3 in the present embodiment is arbitrary.

Figure 6B:
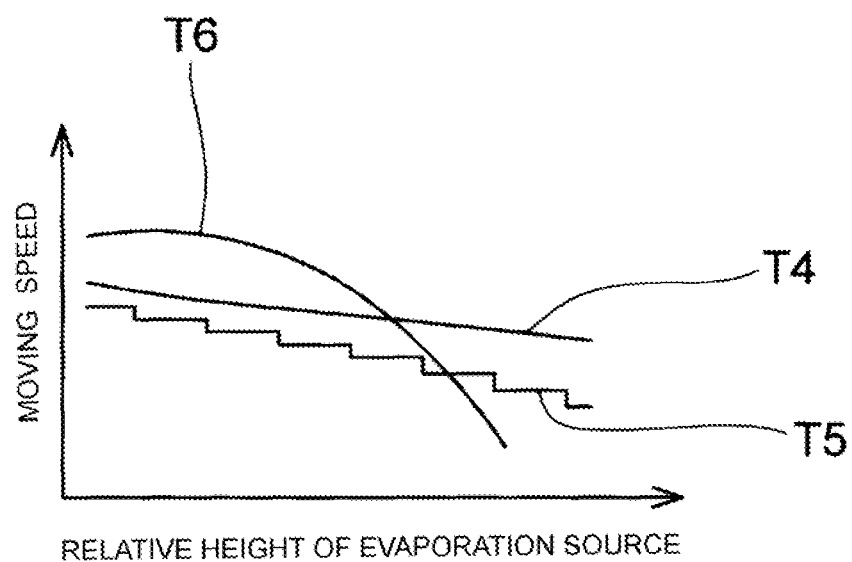
FIG. 6B shows a diagram of another example of the way to suppress layer thickness variation in the method of forming a film according to one embodiment.

FIG. 6B shows an example of moving speed adjusting method in a case that a layer thickness variation is suppressed by changing the relative moving speed of the evaporation source 3 with respect to the substrate S. The horizontal axis in FIG. 6B shows the relative height of the evaporation source 3 with respect to the substrate S, while the vertical axis therein shows the relative moving speed of the evaporation source 3. The three lines respectively marked with symbols T4 to T6 as shown in FIG. 6B show changes in the moving speed of the evaporation source 3 being adjusted in accordance with the height of the evaporation source 3. The higher the position of the evaporation source 3 is, the lower the vapor deposition efficiency is, therefore, in any of the supplying amount changes T4 to T6, the moving speed decreases as the height of the evaporation source 3 increases. A good deal of vapor deposition materials can be deposited since the evaporation source 3 moves slowly.

As shown in the moving speed changes T4 to T6 in FIG. 6B, the moving speed of the evaporation source 3 can also be changed in an arbitrary mode of change in accordance with the height of the evaporation source 3. For example, in a case of the rate of change of the layer thickness being less in conjunction with the rise of the evaporation source 3, the rate of decrease in the moving speed is preferably increased in conjunction with a rise of the evaporation source 3 as in the moving speed change T6. Moreover, it is more preferable that the speed of relative movement of the evaporation source 3 with respect to the substrate S be changed based on the height of the evaporation source 3 and the relationship between the moving speed and the layer thickness such that the change in layer thickness according to the height of the evaporation source 3 in a case that suppressing of the layer thickness variation as in the present embodiment is not carried out is canceled out. However, the mode of change in the moving speed of the evaporation source 3 based on the relative height of the evaporation source 3 in the present embodiment is arbitrary.

In a case that two substrates S are arranged in the chamber 11 as in the example in FIG. 1 in the layer forming method according to the present embodiment, while the vapor deposition material can be simultaneously supplied onto the two substrates S from the evaporation source 3, the vapor deposition material can be supplied onto each of the two substrates in sequence. For example, the vapor deposition material can be supplied onto one of the two substrates S when the evaporation source 3 moves upward, while the vapor deposition material can be supplied onto the other of the two substrates S when the evaporation source S moves downward. In other words, as shown in FIG. 4A, when the vapor deposition material is supplied toward one substrate S (first substrate) being held by the first holding unit 21 of the substrate holder 2, the evaporation source 3 is moved upward (in first orientation) relative to the first substrate S. Then, as shown in FIG. 4B, when the vapor deposition material is supplied toward a substrate S (second substrate) being held by the second holding unit 22 of the substrate holder 2, the evaporation source 3 is moved in an orientation opposite to the first orientation with respect to upward/downward, or, in other words, in a downward orientation relative to the second substrate S. In this way, as described in the explanations of the film forming apparatus 1 according to the first embodiment, the vapor deposition layer can be formed on the two substrates S efficiently while decreasing waste of the vapor deposition material.

Moreover, in a case that the two substrates S are arranged in the chamber 11, as shown in FIGS. 4A and 4B, while supplying the vapor deposition material toward one substrate S (first substrate), it is preferable to align the other substrate S (second substrate) and the vapor deposition mask M. Similarly, while supplying the vapor deposition material toward the other substrate S (the second substrate), it is preferable to align the one substrate S (the first substrate) and the vapor deposition mask M. In this way, alignment of the vapor deposition mask M and the substrate S and supplying of the vapor deposition material can be carried out in parallel to reduce the waiting time of the evaporation source 3 and efficiently form the vapor deposition layer onto the plurality of substrates S.

(Method of Manufacturing an Organic-EL Display Apparatus)

Herein below, a method of manufacturing an organic-EL display apparatus according to third embodiment is explained with reference to FIGS. 7 and 8. In the method of manufacturing an organic-EL display apparatus according to the present embodiment, an organic deposition layer is formed using the previously-described method of forming a vapor deposition layer according to the second embodiment. As well-known techniques are used for steps other than the step of forming the vapor deposition layer, explanations of these steps will be omitted or simplified as needed, so that a method of forming an organic layer is mainly described.

The method of manufacturing an organic-EL display apparatus according to the third embodiment comprises forming a TFT 105, a planarizing layer 106, and a first electrode (an anode, for example) 102 on a supporting substrate 101; and vapor depositing an organic material above the supporting substrate 101 using the previously-described method of forming a vapor deposition layer according to the second embodiment, and thereby forming an organic deposition layer 103. The method of manufacturing an organic-EL display apparatus according to the present embodiment further comprises forming a second electrode 104 (a cathode, for example) on the organic deposition layer 103.

A drive element such as the TFT 105 is formed on the supporting substrate 101 such as a glass plate, for example, for each RGB sub-pixel of each pixel, and the first electrode 102 connected to the drive element is formed on the planarizing layer 106 by a combination of a metal layer such as Ag or APC, and an ITO layer. Between the sub-pixels, an insulation bank 107 comprising a polyimide resin, an acrylic resin, or $SiO_2$ and partitioning the sub-pixels is formed as shown in FIGS. 7 and 8. The organic deposition layer 103 is formed above the supporting substrate 101 using the film forming apparatus 1 according to the previously-described first embodiment, for example.

The supporting substrate 101 is held in a standing position relative to the horizontal surface in a film forming apparatus for the vapor deposition layer, while a surface to be vapor deposited 101a onto which the insulation bank 107 has been formed is oriented to a region in which the evaporation source 3 is provided. Moreover, the supporting substrate 101 is caused to be inclined relative to the vertical surface such that the upper end of the supporting substrate 101 is brought farther away from the evaporation source 3. The supporting substrate 101 is caused to be inclined relative to the vertical surface at an arbitrary timing up to the start of vapor deposition after the supporting substrate 101 is introduced into the film forming apparatus. Adopting a method to hold the supporting substrate 101 in this way makes it possible to reduce an increase in the installation area of the film forming apparatus in conjunction with upsizing of the supporting substrate 101 and stably bring the supporting substrate 101 and the vapor deposition mask M into close contact with each other. The vapor deposition mask M is put onto the insulation bank 107 of the supporting substrate 10 after the alignment. For example, using a magnetic plate 41 (see FIG. 3), the supporting substrate 101 and the vapor deposition mask M possibly comprising a metal frame can be attracted to each other.

Figure 7:
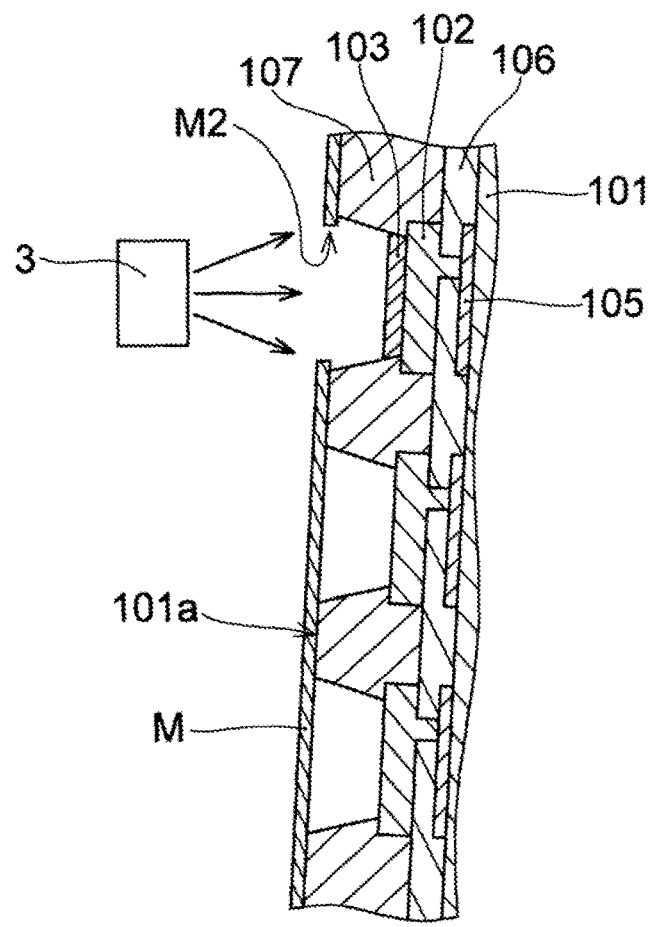
FIG. 7 shows a diagram of one example of a vapor deposition process in a method of manufacturing an organic-EL display apparatus according to one embodiment of the present invention.

In this state, as shown in FIG. 7, the vapor deposition material mainly comprising organic matter is supplied from the evaporation source 3. The vapor deposition material is vapor deposited only onto a portion, of the supporting substrate 101, which is exposed to an aperture M2 of the vapor deposition mask M, and the organic deposition layer 103 is formed on the first electrode 102 of a desired sub-pixel. While supplying the vapor deposition material, the evaporation source 3 is relatively moved along a vertical direction in either upward or downward orientation relative to the supporting substrate 101. As the supporting substrate 101 is caused to be inclined with respect to the vertical surface, as described previously, the thickness of the deposition layer 103 to be formed varies from the lower end portion to the upper end portion of the supporting substrate 101. According to the present embodiment, in a manner similar to the method of forming a vapor deposition layer according to the second embodiment, the vapor deposition material is vapor deposited on the supporting substrate 101 while reducing a variation in a thickness of the deposition layer 103 by compensating for the difference based on the inclination of the supporting substrate 101 in vapor deposition efficiency within the surface to be vapor deposited 101*a*. As described previously, the difference in vapor deposition efficiency can be compensated for, for example, by changing the supplying amount of the vapor deposition material, changing the speed of relative movement of the evaporation source 3 with respect to the supporting substrate 101, or causing the supporting substrate 101 and the evaporation source 3 to be brought closer to or farther away from each other in the horizontal direction, based on the relative height of the evaporation source 3 with respect to the supporting substrate 101. In the method of manufacturing an organic-EL display apparatus according to the present embodiment, the difference in vapor deposition efficiency is compensated for in this way, so that the organic deposition layer 103 having high uniformity in its layer thickness is formed over the entirety of the surface to be vapor deposited 101*a*. Therefore, according to the method of manufacturing an organic-EL display apparatus according to the present embodiment, it is possible to manufacture the organic-EL display apparatus having a small variation in display quality.

Figure 8:
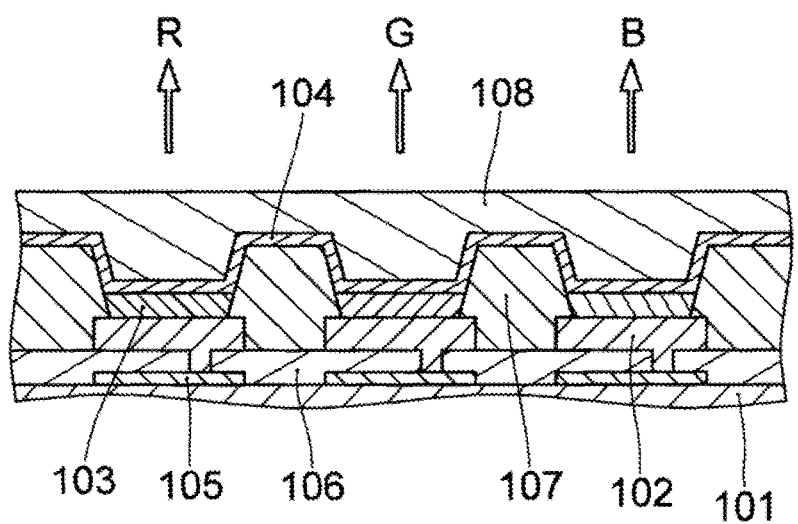
FIG. 8 shows a diagram of a state in which an organic layer is deposited in the method of manufacturing an organic-EL display apparatus according to one embodiment of the present invention.

While the organic deposition layer 103 is shown simply as one layer in FIGS. 7 and 8, the organic deposition layer 103 can be formed as a plurality of organic deposition layers 103 made of different materials. For example, a positive-hole injection layer made of a material having a good ionization energy compatibility can be provided as a layer being in contact with the anode 102. A positive-hole transport layer is formed using an amine-based material, for example, on the positive-hole injection layer. Moreover, a light-emitting layer selected in accordance with the light-emitting wavelength is formed on the positive-hole injection layer with Alq$_3$ to which an organic fluorescent material of red or green is doped for red or green, for example. Moreover, as a material for blue, a DSA-based organic material is used. On the light-emitting layer, an electron transport layer is further formed using Alq$_3$. The organic deposition layer 103 can be formed by stacking such individual layers each having approximately several tens of nm in thickness. While an electron injecting layer comprising LiF or Liq can be provided between the organic layer and a cathode 104, in the present embodiment, the whole layers formed between the first electrode 102 and the second electrode 104, including such an electron injecting layer, is called the organic deposition layer 103.

After the whole organic deposition layers 103 are formed, the second electrode 104 is formed on the entire surface. In a case that the organic-EL display apparatus to be manufactured is a top-emission type, the second electrode 104 is formed by a light transmitting material, for example, a thin-film Mg—Ag eutectic layer. Besides, Al can be used. In a case that the organic-EL display apparatus to be manufactured is a bottom-emission type, ITO or In$_3$O$_4$ is used for the first electrode 102, while a metal with a small work function, for example, Mg, K, Li, or Al can be used for the second electrode 104. On the surface of the second electrode 104, a protection layer 108 comprising Si$_3$N$_4$, for example, is formed. Moreover, a sealing layer comprising glass or moisture-resistant resin film (not shown) is formed, to prevent penetration of moisture into the organic deposition layer 103. As one example, the organic-EL display apparatus can be manufactured by undergoing the processes as described above.

SUMMARY (1) A film forming apparatus according to first embodiment of the present invention comprises: a substrate holder to hold a substrate in a standing position relative to a horizontal surface, the substrate comprising a surface to be vapor deposited, the surface being a surface on which a vapor deposition layer is formed; and an evaporation source to supply a vapor deposition material toward the surface to be vapor deposited while carrying out a relative movement in at least either one of upward and downward orientations relative to the substrate holder, the evaporation source being provided in a region toward which the surface to be vapor deposited of the substrate being held by the substrate holder is to be oriented, wherein the substrate holder is configured to hold the substrate with an inclination relative to a vertical surface such that an upper end of the substrate is brought to be farther away from the evaporation source, and the film forming apparatus further comprises an adjusting instrument to decrease a variation in a thickness of the vapor deposition layer on the surface to be vapor deposited, the variation being based on the inclination of the substrate.

The configuration of (1) makes it possible to form a vapor deposition layer having high uniformity in its thickness on the entire surface and, even more, to avoid an increase of the installation area of a film forming apparatus in conjunction with upsizing of a member to be vapor deposited.

(2) In the film forming apparatus according to (1) in the above, the substrate holder can comprise a first holding unit and a second holding unit to hold respective substrates each being the substrate such that respective surfaces to be vapor deposited of the respective substrates face each other; and the evaporation source can supply the vapor deposition material while carrying out the relative movement relative to the substrate holder between the substrate held by the first holding unit and the substrate held by the second holding unit. In that case, vapor deposition layers can be formed efficiently onto the two substrates.

(3) The film forming apparatus according to (2) in the above can further comprise: a mask holder to hold a vapor deposition mask to be put onto the surface to be vapor deposited of the substrate; and an alignment unit to carry out alignment between the vapor deposition mask held by the mask holder and the substrate held by the substrate holder, wherein while the vapor deposition material is being supplied toward the substrate held by either one of the first holding unit and the second holding unit, the alignment unit can carry out the alignment for the substrate onto which the vapor deposition material is not being supplied. In that case, waiting time of the evaporation source can be reduced and it is possible to form a vapor deposition layer very efficiently.

(4) In the film forming apparatus according to (2) or (3) in the above, the evaporation source can move in a first orientation relative to the substrate holder when the vapor deposition material is supplied toward the substrate held by the first holding unit and can move in an orientation opposite the first orientation with respect to a vertical direction relative to the substrate holder when the vapor deposition material is supplied toward the substrate held by the second holding unit. In that case, the vapor deposition material is continuously supplied so that it is possible to stabilize the supplying amount, and, even more, form the vapor deposition layer efficiently while reducing waste of the vapor deposition material.

(5) In the film forming apparatus according to any one of (2) to (4) in the above, the evaporation source can comprise: a first nozzle and a second nozzle each of which supplies the vapor deposition material, the first nozzle and the second nozzle being oriented to respective orientations opposite each other; a member to stop supplying from the first nozzle when the vapor deposition material is to be supplied from the second nozzle; and a member to stop supplying from the second nozzle when the vapor deposition material is to be supplied from the first nozzle. In that case, it is possible to prevent the vapor deposition material from unintentionally sticking onto the substrate toward which the vapor deposition material is not supplied.

(6) In the film forming apparatus according to any one of (1) to (5) in the above, the apparatus can comprise, as the adjusting instrument, a supplying amount adjusting unit to change a supplying amount of the vapor deposition material to be supplied from the evaporation source, based on a relative height of the evaporation source with respect to the substrate holder. In that case, a variation in thickness of the vapor deposition layer can be reduced.

(7) In the film forming apparatus according to any one of (1) to (6) in the above, the apparatus can comprise, as the adjusting instrument, a speed changing instrument to change a speed of the relative movement based on a relative height of the evaporation source with respect to the substrate holder. In that case, a variation in thickness of the vapor deposition layer can be reduced.

(8) In the film forming apparatus according to any one of (1) to (7) in the above, the apparatus can comprise a moving instrument, as the adjusting instrument, with respect to one or both of the evaporation source and the substrate holder, wherein the moving instrument brings the evaporation source and the substrate held by the substrate holder closer to or farther away from each other in a horizontal direction based on a relative height of the evaporation source with respect to the substrate holder. In that case, a variation in thickness of the vapor deposition layer can be reduced.

(9) A method of forming a vapor deposition layer according to second embodiment of the present invention comprises: arranging, in a vapor deposition apparatus, a substrate in a standing position relative to a horizontal surface, the substrate comprising a surface to be vapor deposited, the surface being a surface on which a vapor deposition layer is formed; and depositing a vapor deposition material onto the surface to be vapor deposited by supplying the vapor deposition material from an evaporation source being provided in a region toward which the surface to be vapor deposited of the substrate is oriented, while causing the evaporation source to carry out a relative movement in at least either one of upward and downward orientations relative to the substrate, wherein at the time of supplying the vapor deposition material, the substrate is held with an inclination relative to a vertical surface such that an upper end of the substrate is brought to be farther away from the evaporation source, and the vapor deposition material is deposited while a variation in a thickness of the vapor deposition layer is decreased by compensating for a difference in vapor deposition efficiency within the surface to be vapor deposited, the difference being based on the inclination of the substrate.

The configuration of (9) makes it possible to form a vapor deposition layer having high uniformity in its thickness on the entire surface and, even more, to avoid an increase of the installation area of a film forming apparatus in conjunction with upsizing of a member to be vapor deposited.

(10) In the method of forming a vapor deposition layer according to (9) in the above, each of two substrates can be arranged as the substrate in the vapor deposition apparatus such that respective surfaces to be vapor deposited of the two substrates face each other, the two substrates comprising a first substrate and a second substrate; and at the time of supplying the vapor deposition material, the vapor deposition material can be supplied from the evaporation source toward each of the two substrates simultaneously or in sequence while the evaporation source carries out the relative movement relative to the two substrates between the two substrates. In this way, the vapor deposition layers can be formed efficiently onto the two substrates.

(11) The method of forming a vapor deposition layer according to (10) in the above can further comprise aligning a vapor deposition mask and the substrate, and arranging the vapor deposition mask and the substrate so as to overlap each other, wherein the second substrate and the vapor deposition mask can be aligned, and can be arranged so as to overlap each other while the vapor deposition material is supplied toward the first substrate. In this way, the waiting time of the evaporation source can be reduced and the vapor deposition layer can be formed very efficiently.

(12) In the method of forming a vapor deposition layer according to (10) or (11) in the above, the evaporation source can be moved in a first orientation relative to the first substrate when the vapor deposition material is supplied toward the first substrate and the evaporation source can be moved in an orientation opposite the first orientation with respect to a vertical direction relative to the second substrate when the vapor deposition material is supplied toward the second substrate. This makes it possible to form the vapor deposition layer with a stabilized supplying amount and, even more, efficiently, while reducing waste of the vapor deposition material.

(13) In the method of forming a vapor deposition layer according to any one of (9) to (12) in the above, the difference in the vapor deposition efficiency can be compensated for by changing a supplying amount of the vapor deposition material from the evaporation source based on a relative height of the evaporation source with respect to the substrate. This makes it possible to reduce a variance in thickness of the vapor deposition layer.

(14) In the method of forming a vapor deposition layer according to any one of (9) to (13) in the above, the difference in vapor deposition efficiency can be compensated for by changing a speed of the relative movement based on a relative height of the evaporation source with respect to the substrate. This makes it possible to reduce a variance in thickness of the vapor deposition layer.

(15) In the method of forming a vapor deposition layer according to any one of (9) to (14) in the above, the difference in the vapor deposition efficiency can be compensated for by bringing the substrate and the evaporation source closer to or farther away from each other in a horizontal direction based on a relative height of the evaporation source with respect to the substrate. This makes it possible to reduce a variance in thickness of the vapor deposition layer.

(16) A method of manufacturing an organic-EL display apparatus according to third embodiment of the present invention comprises: forming at least a TFT and a first electrode on a supporting substrate; vapor depositing an organic material above the supporting substrate using the method of forming a vapor deposition layer according to any one of (9) to (15) in the above, and thereby forming an organic deposition layer; and forming a second electrode on the organic deposition layer. This configuration makes it possible to reduce a variation in display quality of the organic-EL display apparatus.

DESCRIPTION OF REFERENCE NUMERALS 1 film forming apparatus
13 drive unit 14a, 14b moving instrument
2 substrate holder
21 first holding unit
22 second holding unit
3, 3a evaporation source
31, 31a to 31c evaporation unit
32, 3aa to 3af supplying unit
321 first nozzle
322 second nozzle
34 first supplying amount adjusting unit
35 second supplying amount adjusting unit
4 mask holder
51 control unit
6 alignment unit
101 supporting substrate
102 first electrode
103 deposition layer
104 second electrode
M vapor deposition mask
S substrate
Sa surface to be vapor deposited

The invention claimed is:

1. A film forming apparatus comprising:
a substrate holder to hold a substrate in a standing position relative to a horizontal surface, the substrate comprising a surface to be vapor deposited, the surface being a surface on which a vapor deposition layer is formed; and
an evaporation source to supply a vapor deposition material toward the surface to be vapor deposited while carrying out a relative movement in at least either one of upward and downward orientations relative to the substrate holder, the evaporation source being provided in a region toward which the surface to be vapor deposited of the substrate being held by the substrate holder is to be oriented, wherein
the substrate holder is configured to hold the substrate with an inclination relative to a vertical surface such that an upper end of the substrate is brought to be farther away from the evaporation source,
the film forming apparatus further comprises an adjusting instrument to decrease a variation in a thickness of the vapor deposition layer on the surface to be vapor deposited, the variation being based on the inclination of the substrate, and
the adjusting instrument is selected from a group consisting of:
a supplying amount adjusting unit to change a supplying amount of the vapor deposition material to be supplied from the evaporation source, based on a relative height of the evaporation source with respect to the substrate holder;
a speed changing instrument to change a speed of the relative movement based on the relative height of the evaporation source with respect to the substrate holder; and
a moving instrument with respect to one or both of the evaporation source and the substrate holder, wherein the moving instrument brings the evaporation source and the substrate held by the substrate holder closer to or farther away from each other in a horizontal direction based on the relative height of the evaporation source with respect to the substrate holder.

2. The film forming apparatus according to claim 1, wherein
the substrate holder comprises a first holding unit and a second holding unit to hold respective substrates each being the substrate such that respective surfaces to be vapor deposited of the respective substrates face each other; and
the evaporation source supplies the vapor deposition material while carrying out the relative movement relative to the substrate holder between the substrate held by the first holding unit and the substrate held by the second holding unit.

3. The film forming apparatus according to claim 2, further comprising:
a mask holder to hold a vapor deposition mask to be put onto the surface to be vapor deposited of the substrate; and
an alignment unit to carry out alignment between the vapor deposition mask held by the mask holder and the substrate held by the substrate holder, wherein
while the vapor deposition material is being supplied toward the substrate held by either one of the first holding unit and the second holding unit, the alignment unit carries out the alignment for the substrate onto which the vapor deposition material is not being supplied.

4. The film forming apparatus according to claim 2, wherein the evaporation source moves in a first orientation relative to the substrate holder when the vapor deposition material is supplied toward the substrate held by the first holding unit and moves in an orientation opposite the first orientation with respect to a vertical direction relative to the substrate holder when the vapor deposition material is supplied toward the substrate held by the second holding unit.

5. The film forming apparatus according to claim 2, wherein the evaporation source comprises: a first nozzle and a second nozzle each of which supplies the vapor deposition material, the first nozzle and the second nozzle being oriented to respective orientations opposite each other; a member to stop supplying from the first nozzle when the vapor deposition material is to be supplied from the second nozzle; and a member to stop supplying from the second nozzle when the vapor deposition material is to be supplied from the first nozzle.

6. A method of forming a vapor deposition layer, comprising:
arranging in a vapor deposition apparatus, a substrate in a standing position relative to a horizontal surface, the substrate comprising a surface to be vapor deposited, the surface being a surface on which a vapor deposition layer is formed; and
depositing a vapor deposition material onto the surface to be vapor deposited by supplying the vapor deposition material from an evaporation source being provided in a region toward which the surface to be vapor deposited of the substrate is oriented, while causing the evaporation source to carry out a relative movement in at least either one of upward and downward orientations relative to the substrate,
wherein at the time of supplying the vapor deposition material, the substrate is held with an inclination relative to a vertical surface such that an upper end of the substrate is brought to be farther away from the evaporation source,
wherein the vapor deposition material is deposited while a variation in a thickness of the vapor deposition layer is decreased by compensating for a difference in vapor deposition efficiency within the surface to be vapor deposited, the difference in the vapor deposition efficiency being based on the inclination of the substrate, and the difference in the vapor deposition efficiency is compensated for by:
  changing a supplying amount of the vapor deposition material from the evaporation source based on a relative height of the evaporation source with respect to the substrate, wherein the supplying amount of the vapor deposition material from the evaporation source is increased in conjunction with a rise of the evaporation source;
  changing a speed of the relative movement based on the relative height of the evaporation source with respect to the substrate; or
  bringing the substrate and the evaporation source closer to or farther away from each other in a horizontal direction based on the relative height of the evaporation source with respect to the substrate, wherein when the evaporation source is positioned around a lower end portion of the substrate, the substrate and the evaporation source are brought farther away from each other in the horizontal direction compared to when the evaporation source is positioned around an upper end portion of the substrate.

7. The method of forming the vapor deposition layer according to claim 6, wherein:
  each of two substrates is arranged as the substrate in the vapor deposition apparatus such that respective surfaces to be vapor deposited of the two substrates face each other, the two substrates comprising a first substrate and a second substrate; and
  at the time of supplying the vapor deposition material, the vapor deposition material is supplied from the evaporation source toward each of the two substrates simultaneously or in sequence while the evaporation source carries out the relative movement relative to the two substrates between the two substrates.

8. The method of forming the vapor deposition layer according to claim 7, the method further comprising aligning a vapor deposition mask and the substrate, and arranging the vapor deposition mask and the substrate so as to overlap each other,
  wherein the second substrate and the vapor deposition mask are aligned, and arranged so as to overlap each other while the vapor deposition material is supplied toward the first substrate.

9. The method of forming the vapor deposition layer according to claim 7, wherein the evaporation source is moved upward when the vapor deposition material is supplied toward the first substrate and the evaporation source is moved downward when the vapor deposition material is supplied toward the second substrate.

10. A method of manufacturing an organic electro-luminance (EL) display apparatus, comprising:
  forming at least a TFT and a first electrode on a supporting substrate;
  vapor depositing an organic material above the supporting substrate using the method of forming a vapor deposition layer according to claim 6, and thereby forming an organic deposition layer; and
  forming a second electrode on the organic deposition layer.

11. The method of forming the vapor deposition layer according to claim 6,
  wherein in a case that the difference in the vapor deposition efficiency is compensated for by changing the speed of the relative movement based on the relative height of the evaporation source with respect to the substrate, the speed of the relative movement is caused to decrease as a height of the evaporation source increases.

12. The method of forming the vapor deposition layer according to claim 6,
  wherein the difference in the vapor deposition efficiency is compensated for by changing the speed of the relative movement based on the relative height of the evaporation source with respect to the substrate,
  wherein the speed of the relative movement is caused to decrease as a height of the evaporation source increases.

13. The method of forming the vapor deposition layer according to claim 6,
  wherein in a case that the difference in the vapor deposition efficiency is compensated for by changing the supplying amount of the vapor deposition material from the evaporation source based on the relative height of the evaporation source with respect to the substrate, the supplying amount of the vapor deposition material from the evaporation source is changed such that the variation in the thickness of the vapor deposition layer according to a height of the evaporation source is canceled out.

14. The method of forming the vapor deposition layer according to claim 6,
  wherein the difference in the vapor deposition efficiency is compensated for by changing the supplying amount of the vapor deposition material from the evaporation source based on the relative height of the evaporation source with respect to the substrate, and
  wherein the supplying amount of the vapor deposition material from the evaporation source is changed such that the variation in the thickness of the vapor deposition layer according to a height of the evaporation source is canceled out.

15. The method of forming the vapor deposition layer according to claim 6,
  wherein in a case that the difference in the vapor deposition efficiency is compensated for by bringing the substrate and the evaporation source closer to or farther away from each other in the horizontal direction based on the relative height of the evaporation source with respect to the substrate, the substrate and the evaporation source are brought closer to or farther away from each other in the horizontal direction such that a distance between the evaporation source and a portion of the surface to be vapor deposited facing the evaporation source in the horizontal direction is kept constant.

16. The method of forming the vapor deposition layer according to claim 6,
  wherein the difference in the vapor deposition efficiency is compensated for by bringing the substrate and the evaporation source closer to or farther away from each other in the horizontal direction based on the relative height of the evaporation source with respect to the substrate, and
  wherein the substrate and the evaporation source are brought closer to or farther away from each other in the horizontal direction such that a distance between the evaporation source and a portion of the surface to be vapor deposited in the horizontal direction is kept constant.

* * * * *